(12) United States Patent
Clark et al.

(10) Patent No.: US 6,181,218 B1
(45) Date of Patent: Jan. 30, 2001

(54) HIGH-LINEARITY, LOW-SPREAD VARIABLE CAPACITANCE ARRAY

(75) Inventors: Ricke W. Clark, Irvine; Jorge A. Grilo, Foothill Ranch; Bo Zhang, Newport Beach, all of CA (US)

(73) Assignee: Conexant Systems, Inc., Newport Beach, CA (US)

( * ) Notice: Under 35 U.S.C. 154(b), the term of this patent shall be extended for 0 days.

(21) Appl. No.: 09/081,542

(22) Filed: May 19, 1998

(51) Int. Cl.[7] ....................................................... H01G 4/38
(52) U.S. Cl. .................................. 331/177 R; 331/36 C; 331/179; 334/55; 334/78; 455/197.2
(58) Field of Search ............................. 331/177 R, 36 C, 331/177 V, 179; 334/76, 55, 78; 455/197.2

(56) References Cited

U.S. PATENT DOCUMENTS

| 5,117,206 | * | 5/1992 | Imamura | 331/158 |
| 5,322,438 | | 6/1994 | McNutt et al. | |
| 5,610,560 | * | 3/1997 | Sauer et al. | 331/8 |

FOREIGN PATENT DOCUMENTS

| 0 244 020 A2 | 11/1987 | (EP) . |
| 0 431 887 A2 | 6/1991 | (EP) . |
| 0 841 754 A2 | 5/1998 | (EP) . |

OTHER PUBLICATIONS

Microelectronics, second edition, international edition, Jacob Millman, Arvin Grabel, McGraw–Hill Book Company, New York, 1987, pp. 751–756.
International Search Report for corresponding PCT application No. PCT/US 99/08558, priority date May 19, 1998.
Huang, et al., "Design Considerations for High–Frequency Crystal Oscillators Digitally Trimmable to Sub–ppm Accuracy", *IEEE Transactions on Very Large Scale Integration (VLSI) Systems,* vol. 5, No. 4, Dec. 1997.

* cited by examiner

*Primary Examiner*—Arnold Kinkead
(74) *Attorney, Agent, or Firm*—Knobbe, Martens, Olson & Bear, LLP

(57) ABSTRACT

The invention provides a unique apparatus and method which varies the capacitance coupled to a circuit. In one embodiment, the variable capacitance comprises a unique variable capacitance array with multiple capacitance modules which can be selectively enabled. Each capacitance module has a capacitive value and a corresponding parasitic capacitance. The invention provides high linearity, low spread, improves the response to power fluctuations by maintaining a consistent relationship between the capacitive value and the parasitic capacitance in each capacitance module. For example, the invention can be used with devices to provide a linear variation of capacitance. In addition, the invention can be used to calibrate a wide range of devices.

17 Claims, 15 Drawing Sheets

HIGH-LINEARITY, LOW-SPREAD VARIABLE CAPACITANCE ARRAY

FIELD OF THE INVENTION

The invention is an apparatus and method for providing a high-linearity, low-spread variable capacitance array which can be coupled to a wide variety of electronic circuits. More specifically, the invention provides a variable capacitance array which can be used to modify the operation of an oscillator circuit.

BACKGROUND

The communications industry has continually struggled to provide communication equipment at affordable prices. Such communication equipment can include by way of example, mobile and wireless devices such as radios, cellular telephones, cordless phones and the like. Such devices, however, typically operate within narrow frequency ranges with little tolerance for error.

In order to operate at the desired frequencies, such devices often rely on oscillator circuits. Oscillator circuits vibrate or resonate at desired frequencies. A variety of oscillator circuits exist, some of which use transistor networks, feedback circuits, piezoelectric substances and the like.

Conventional systems typically tune an oscillator by varying the amount of capacitance coupled to the oscillator with what are called variable capacitors. In general, a variable capacitor allows one to select a desired capacitive value from a range of capacitive values. For example, adjusting the capacitive value in a variable capacitor alters the amount of capacitance coupled to the oscillator. As a result, the capacitive value modifies the operating frequency of the oscillator.

In many applications, it is desirable to provide a variable capacitor which can be finely tuned. Fine tuning allows a circuit designer to precisely select the value of the variable capacitor with relatively small incremental adjustments. In many conventional variable capacitors, however, the incremental adjustments may not be linear, that is, an incremental change may not be proportionately similar to the previous or following incremental change.

In addition to fine tuned precision, circuit designers also desire the ability to select from a large range of capacitance values. A variable capacitor which provides a relatively wide range of values is said to have a relatively large dynamic range. The large dynamic range is typically achieved by combining capacitors. The ratio of the largest capacitor to the smallest capacitor is often called the capacitance spread. A high-spread capacitance array combines large capacitance values with small capacitance values. On the other hand, in a low-spread capacitance array, the largest capacitor value is closer in value to the smallest capacitor value.

Other applications often need variable capacitors which are stable. That is, once selected, the capacitance value remains relatively constant. In many conventional variable capacitors, however, the value of the selected capacitance can vary due to changes in temperature, operating parameters and external influences.

One common type of variable capacitor used in the communications industry is a varactor diode. In order to improve the performance of varactor diodes, the communications industry has, in some cases, added circuitry to more accurately control the varactor diodes. Unfortunately, varactor diodes are non-linear, thus fine tuning can be difficult to implement. Furthermore, the dynamic range of a varactor diode is dependent on the power supply voltage. The larger the power supply voltage, the larger the dynamic range. Thus, to provide a large dynamic range requires higher voltages.

In addition, conventional varactor diodes and their control circuits are often more sensitive to power fluctuations, can dissipate more power and can add additional weight, can increase manufacturing costs and can consume additional space. As can be appreciated, designers of electronic circuits and particularly designers of hand-held communications devices, desire to improve operating performance, decrease power dissipation, conserve space and reduce weight.

SUMMARY OF THE INVENTION

The present invention provides a unique apparatus and method which varies the capacitance coupled to a circuit. In one embodiment, the variable capacitance comprises a unique variable capacitance array which can be finely tuned within a wide range of capacitor values.

One embodiment of the invention also provides a variable capacitor with increased stability. Thus, the embodiment reduces the amount the capacitance varies or drifts over time. The increased stability improves performance in so called noisy environments wherein operating parameters often fluctuate. Still further, the increased stability improves performance in low cost systems which may use less reliable components.

One embodiment also reduces the number of components required to provide variable capacitors. For example, some embodiments eliminate components such as varactor diodes. As a result, the invention reduces the cost of manufacturing, reduces weight and reduces power dissipation and provides a large dynamic range when compared to varactor diode systems.

One embodiment implements the variable capacitance array on a semiconductor substrate. Advantageously, the unique variable capacitance array accounts for the parasitic capacitance existing in many semiconductor devices. Parasitic capacitance is extraneous capacitance which occurs in semiconductor devices such as integrated circuits. Unlike most discrete components, an integrated circuit comprises a group of densely packed components on multiple layers of material. The proximity of the components and the configuration of the layers produce extraneous (i.e., parasitic) capacitances.

Parasitic capacitances can affect the accuracy and stability of a variable capacitor. In one embodiment, the variable capacitance array accounts for the parasitic capacitance with a variety of components and design configurations. As a result, when compared to discrete components such as varactor diodes, the integrated circuit embodiment of the variable capacitance array provides high-linearity, low spread, improved response to power supply rejections, while reducing power dissipation, and manufacturing costs.

In one embodiment, a wireless communications device has an operating frequency which can be varied with a variable capacitor. The wireless communications device comprises wireless communications circuitry which is configured to transmit and receive data. The wireless communications device further comprises an oscillator which is in communication with the wireless communications circuitry.

The oscillator is configured to generate a signal with a variable which alters the operation of the wireless communications circuitry. Furthermore, the oscillator is configured to vary the frequency of the signal in response to different capacitance values.

The wireless communications device further comprises a first capacitance module and a second capacitance module which are in communication with the oscillator. The first capacitance module comprises a first capacitance value, a first switch and a first parasitic capacitance value. The second capacitance module is in communication with the first capacitance module and comprises a second capacitance value, a second switch, and a second parasitic capacitance value.

The second capacitance value is different in magnitude than the first capacitance value. Furthermore, the ratio of the second capacitance value to the second parasitic capacitance is similar to the ratio of the first capacitance value to the first parasitic capacitance.

The wireless communications device further comprises a control signal which is coupled to the first and second switches. The control signal is configured to selectively enable the first and second switches in a manner which varies the amount of capacitance applied to the oscillator.

In another embodiment, the wireless communications device further comprises a plurality of first capacitance modules and a plurality of second capacitance modules. In yet another embodiment, the control signal varies the amount of capacitance by approximately two femtofarads. In still another embodiment, the control signal varies the amount of capacitance by more than sixteen picofarads.

In another embodiment, the first capacitance value comprises at least one capacitor organized in series with the first switch. In yet another embodiment, the second capacitance value comprises at least two capacitors, one of the capacitors organized in series with the second switch and one of the capacitors organized in parallel with the second switch.

In another embodiment, the wireless communications device further comprises a third capacitance module which is in communication with the second capacitance module. The third capacitance module comprises a third capacitance value, a third switch and a third parasitic capacitance value which is different in magnitude than the first capacitance value or the second capacitance value. Furthermore, the ratio of the third capacitance value to the third parasitic capacitance is similar to the ratio of the first capacitance value to the first parasitic capacitance.

In another embodiment, the third capacitance value comprises at least three capacitors wherein one of the capacitors organized in parallel with the third switch and two of the capacitors organized in series with the third switch. In yet another embodiment, the third switch selectively enables at least one of the capacitors.

According to another aspect of the invention, a capacitance adjustment array comprises a first capacitance module and a second capacitance module. The first capacitance module comprises a first capacitance value, a first set of switches and a first parasitic capacitance value. Likewise the second capacitance module comprises a second capacitance value, a second set of switches and a second parasitic capacitance value.

The second capacitance value is different in magnitude than the first capacitance value. The relationship of the second capacitance value and the second parasitic capacitance value, however, is similar to the relationship of the first capacitance value and the first parasitic capacitance value.

In another embodiment of the capacitance adjustment array, the number of switches in the first set of switches differs from the number of switches in the second set of switches. In yet another embodiment, the first parasitic capacitance value comprises the parasitic capacitance associated with the first capacitance value and the first set of switches. In still another embodiment, the second parasitic capacitance value comprises the parasitic capacitance associated with the second capacitance value and the second set of switches.

In another embodiment of the capacitance adjustment array, the first capacitance module further comprises a first connection line. In yet another embodiment, the second capacitance module further comprises a second connection line, wherein the size of the second connection line differs in size from the size of the first connection line.

In another embodiment of the capacitance adjustment array, the first parasitic capacitance value comprises the parasitic capacitance associated with the first capacitance value, the first set of switches and the first connection line. In yet another embodiment, the second parasitic capacitance value comprises the parasitic capacitance associated with the second capacitance value, the second set of switches and the second connection line.

In another aspect of the invention, a method provides a variable capacitance by providing a first capacitance value which differs from a second capacitance value. The method further comprises defining a relationship between the first capacitance value and a first parasitic capacitance value. In addition, the method comprises maintaining a similar relationship between the second capacitance value and a second parasitic capacitance value.

In yet another embodiment, the act of maintaining a similar relationship further comprises adding non-functional elements to increase the second parasitic capacitance value. In still another embodiment, the act of maintaining a similar relationship further comprises adding switches to increase the second parasitic capacitance value. In still another embodiment, the act of maintaining a similar relationship further comprises increasing the size of a connection line to increase the second parasitic capacitance value.

In another aspect of the invention, a method provides a variable capacitance by providing a first capacitance value which differs from a second capacitance value. The method further comprises defining a relationship between the first capacitance value and a first parasitic capacitance value. In addition, the method comprises maintaining a similar relationship between the second capacitance value and a second parasitic capacitance value by increasing the second parasitic capacitance with at least one non-functional element.

In another embodiment, the act of maintaining a similar relationship increases the second parasitic capacitance with at least one non-functional switch. In yet another embodiment, the act of maintaining a similar relationship increases the second parasitic capacitance with at least one non-functional connection line.

In another embodiment, the act of maintaining a similar relationship increases the second parasitic capacitance with at least one functional switch. In yet another embodiment, the act of maintaining a similar relationship increases the second parasitic capacitance with at least one functional connection line.

In another aspect of the invention, a method provides capacitance within an integrated circuit by providing a first set of capacitors which differs from and a second set of capacitors. The method further comprises defining a ratio between the first set of capacitors and a first parasitic capacitance value. The method also comprises maintaining a similar ratio between the second set of capacitors and a second parasitic capacitance value.

In another embodiment the method also comprises providing a first set of switches wherein at least one of the switches selectively enables at least one of the first set of capacitors. In yet another embodiment, the first set of switches and the first set of capacitors define a first capacitance module. In still another embodiment, the method also comprises providing a plurality of first capacitance modules.

In another embodiment, the method also comprises providing a second set of switches wherein at least one of the switches selectively enables at least one of the second set of capacitors. In yet another embodiment, the second set of switches and the second set of capacitors define a second capacitance module. In still another embodiment, the method also comprises providing a plurality of second capacitance modules.

In another aspect of the invention, an apparatus provides capacitance within an integrated circuit. The apparatus comprises a first capacitance value, a second capacitance value and a third capacitance value. The second capacitance value is coupled in series with the first capacitance value and the third capacitance value is coupled in parallel with the second capacitance value.

The apparatus also comprises at least one switch which is coupled to the third capacitance value. The apparatus also comprises a first parasitic capacitance value which further comprises the parasitic capacitance associated with the switch and the first, second and third capacitance values.

The apparatus also comprises a second parasitic capacitance value which further comprises the parasitic capacitance associated with the switch and the third capacitance value. Furthermore, the ratio of the second parasitic capacitance value to the third capacitance value is similar to the ratio of the first parasitic capacitance value to the first, second and third capacitance values.

In another embodiment, the switch selectively enables the third capacitance value. In yet another embodiment, the first capacitance value has a first set of capacitors associated therewith. In still another embodiment, the second capacitance value has a second set of capacitors associated therewith. In a further embodiment, the third capacitance value has a third set of capacitors associated therewith.

In another embodiment the apparatus further comprises at least a second switch. In yet another embodiment, the first parasitic capacitance value further comprises the parasitic capacitance associated with the second switch.

BRIEF DESCRIPTION OF THE DRAWINGS

These and other aspects, advantages and novel features of the invention will become more apparent upon reading the following detailed description and upon reference to the accompanying drawings.

DETAILED DESCRIPTION

One embodiment of the present invention is an apparatus and method for varying the capacitance in a variable capacitance array. In one embodiment, the variable capacitance array allows relatively precise adjustments over a wide dynamic range.

In one embodiment, the variable capacitance array has multiple capacitance modules. In one embodiment, a capacitance module comprises at least one capacitor in combination with a switch. In other embodiments, the capacitance module is a pairing of multiple capacitors. In other embodiments, the capacitance module is a region near at least one capacitor. The region includes an area in physical proximity with one or more capacitors and an associated stray or parasitic capacitance. The region can include elements such as connection lines, additional capacitors, the plates of the capacitors, switches, non-operational components or the like.

In one embodiment, each capacitance module selectively enables different capacitance values. The variable capacitance array adjusts the amount of capacitance by enabling and disabling different capacitive values in the capacitance modules. Typically, the amount of capacitance is modified with a switch which enables or disables a capacitance value.

Each capacitance module has a capacitive value and a corresponding parasitic capacitance. The ratio of the capacitance value to the parasitic capacitance is called the parasitic ratio. The parasitic ratio in each capacitance module can vary. In one embodiment, the parasitic ratios in the different capacitance modules are set to similar values. As discussed in further detail below, similar parasitic ratios improve the accuracy and precision of the unique variable capacitor array.

To facilitate a complete understanding of the invention, the remainder of the detailed description is arranged with the following sections and subsections:

A. Architectural Overview Of Exemplary Devices Appropriate For Use With The Variable Capacitance Array
   B. Overview Of The Variable Capacitance Array
      1. The Coarse Adjustment Array
      2. The Fine Adjustment Array
   C. Matching The Parasitic Capacitances In The Coarse Array
   D. Matching The Parasitic Capacitances In The Fine Array
   E. Conclusion

Figure 1:
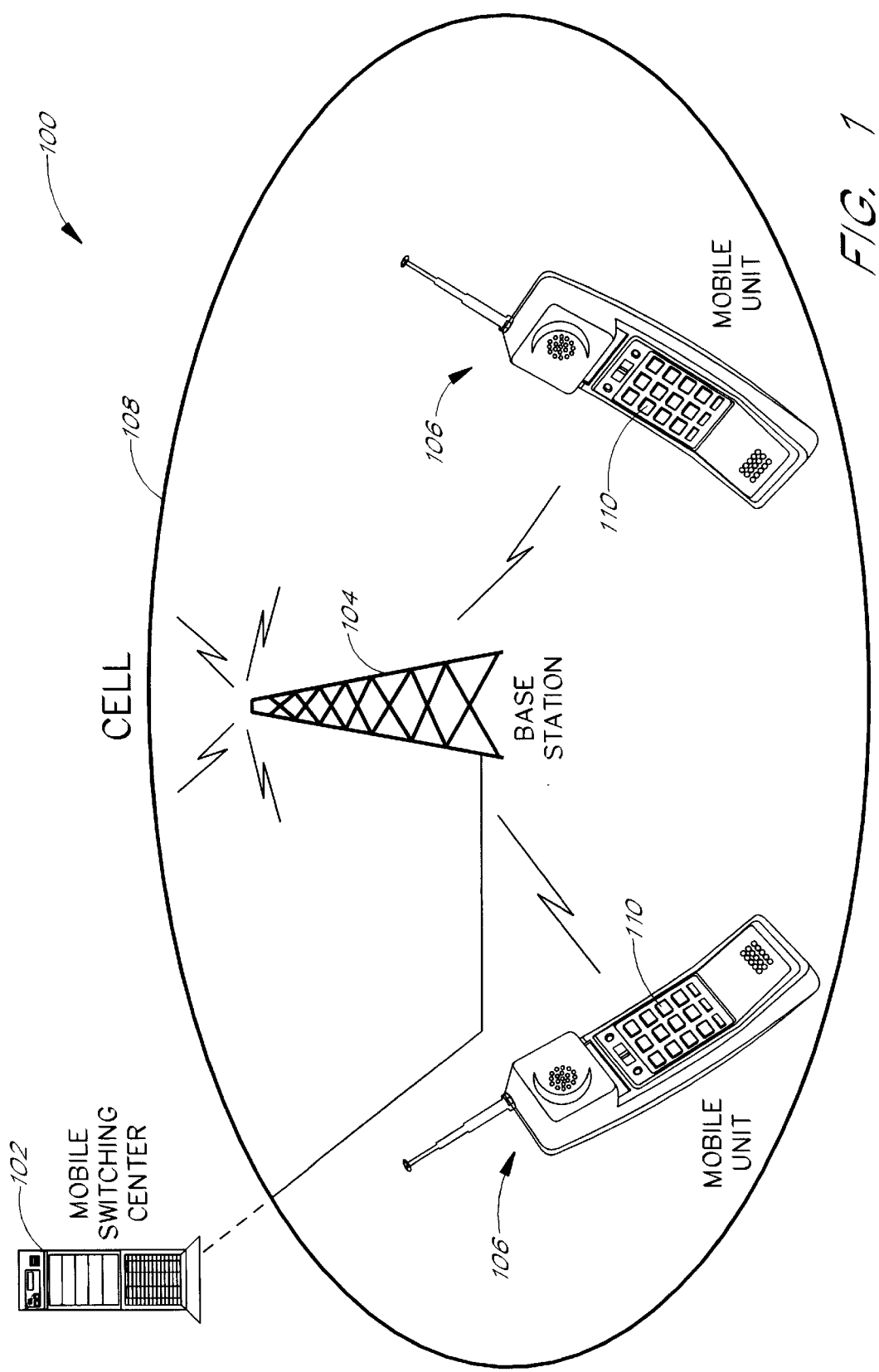
FIG. 1 is a block diagram of one embodiment of a wireless communication system.

A. Architectural Overview Of Exemplary Devices Appropriate For Use With The Variable Capacitance Array FIG. 1 illustrates a communication system 100 appropriate for use with one embodiment of the present invention. A mobile switching center 102 communicates with a base station 104. The base station 104, in turn, broadcasts data to and receives data from mobile units 106 within a cell 108.

Each mobile unit 106 includes communications circuitry 110 which operates in compliance with different communications standards such as the Global System for Mobile (GSM) communications standard. The GSM communications standard is commercially available and includes the definition of the operating frequencies of the mobile units 106 and the base station 104.

The communications circuitry 110 controls the operating frequencies of the mobile units 106. In the GSM communications standard, the communications circuitry 110 transmit in the 890–915 megahertz (MHz) range. To remain compatible with the GSM communications standard, the operating frequencies of the communications circuitry 110 typically vary less than 100 hertz. In other words, the operating frequencies of the communications circuitry 110 typically vary less than 100 parts per billion. Accordingly, the GSM communications standard defines accurate, precise and stable operating frequencies.

Figure 2:
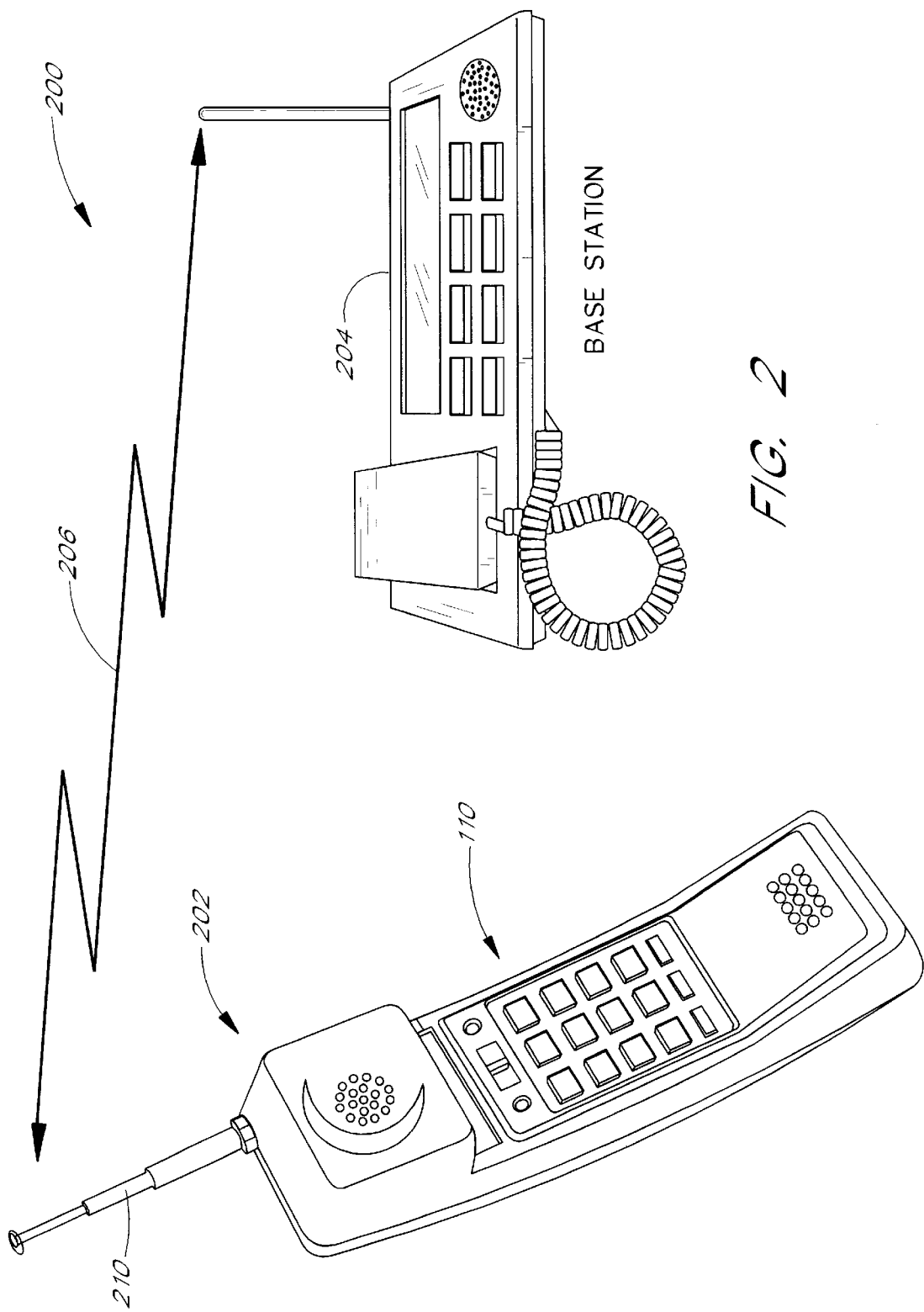
FIG. 2 is a block diagram of one embodiment of a cordless phone system.

FIG. 2 illustrates another communications system 200 appropriate for use with an embodiment of the present invention. The communications system 200 is a cordless telephone system. The communications system 200 comprises a handset 202 and a base station 204. The handset 202 and the base station 204 communicate by sending signals 206 to each other. Such cordless telephone communication systems 206 are commercially available and operate within a wide range of frequencies.

The handset 202 further comprises the communications circuitry 110 which transmits and receives the signals 206. The communications circuitry 110 controls the specific frequencies of the signals 206 transmitted by the handset 202. Likewise, communications circuitry (not shown) in the base station 204 controls the specific frequencies of the signals 206 transmitted by the base station 204.

Figure 3:
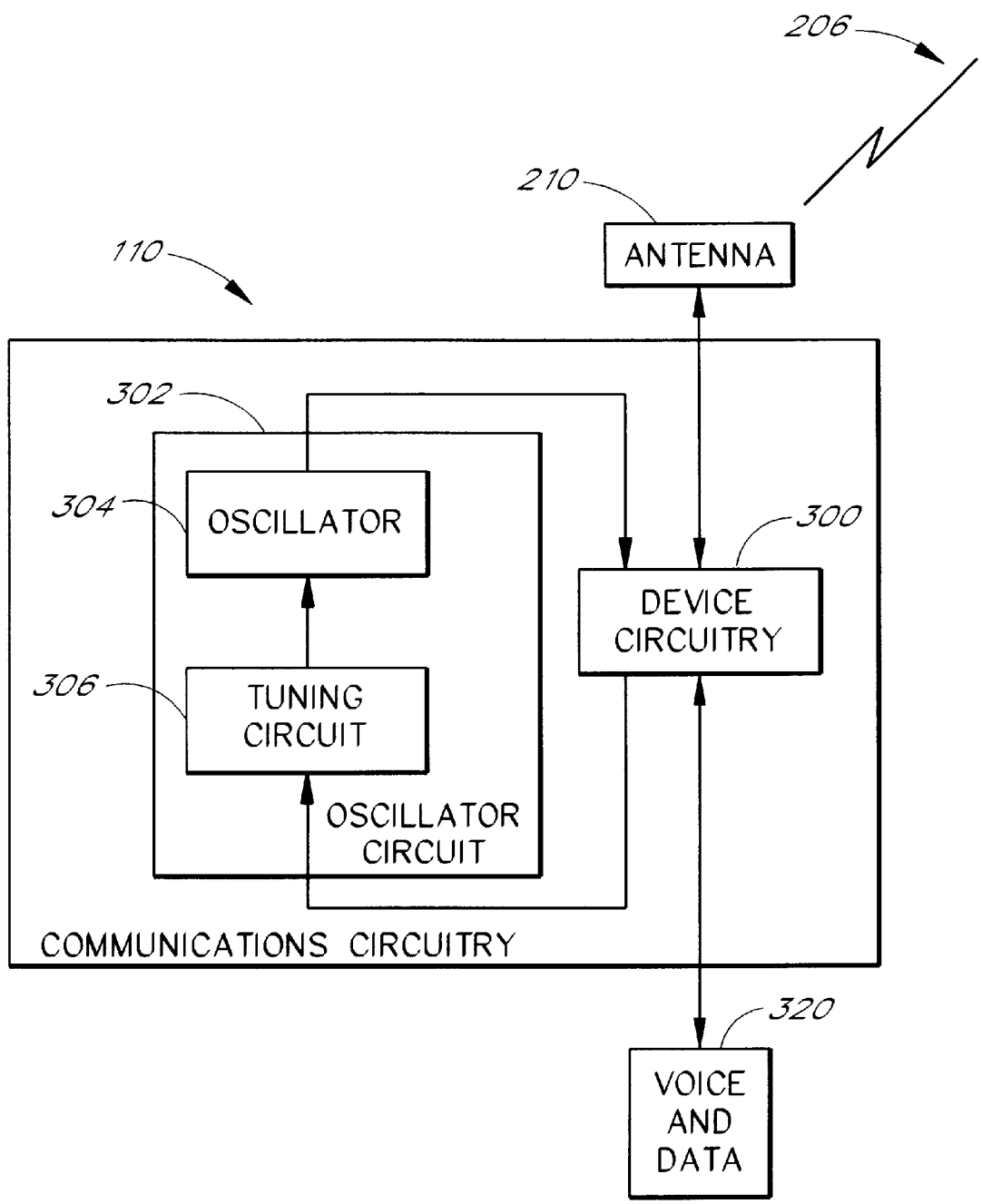
FIG. 3 is a block diagram of one embodiment of a tuning circuit coupled to device circuitry.

A block diagram of the communications circuitry 110 is shown in FIG. 3. The communications circuitry 110 includes device circuitry 300 and an oscillator circuit 302. The device circuitry 300 comprises the components required to process the signals received by and transmitted by the communications circuitry 110. Examples of the device circuitry 300 include commercially available components such as processors, controllers, digital-to-analog converters, analog-to-digital converters, codecs, amplifiers and the like.

Focusing now on the oscillator circuit 302, the oscillator circuit 302 controls the operational frequencies of the signals 206 generated by the communications circuitry 110. As shown in FIG. 3, the oscillator circuit 302 includes an oscillator 304 and a tuning circuit 306.

In one embodiment, the oscillator 304 contains a piezoelectric substance. Piezoelectric substances resonate in response to an electric voltage. Piezoelectric substances include materials such as quartz crystals, various forms of ceramics and the like. One of ordinary skill in the art, however, will recognize that it is also possible to use a wide range of non-piezoelectric oscillators such as transistor networks, feedback circuits and the like.

The tuning circuit 306 adjusts or tunes the operational frequency of the oscillator 304. In one embodiment, the tuning circuit 306 varies the amount of capacitance to modify the operational frequency of the oscillator 304. In other embodiments, the tuning circuit 306 can use combinations of variable capacitance and inductance values to modify the operational frequency of the oscillator 304.

For example, assume that the oscillator 304 generates a signal at a given frequency. The tuning circuit 306 can change the frequency by varying the amount of capacitance coupled to the oscillator 304. The device circuitry 300 then utilizes the oscillator frequency to generate a carrier frequency, a reference frequency, a modulating frequency, a demodulating frequency, a time multiplexer, a clock, a synchronizer, a timing mechanism, or the like.

Figure 4:
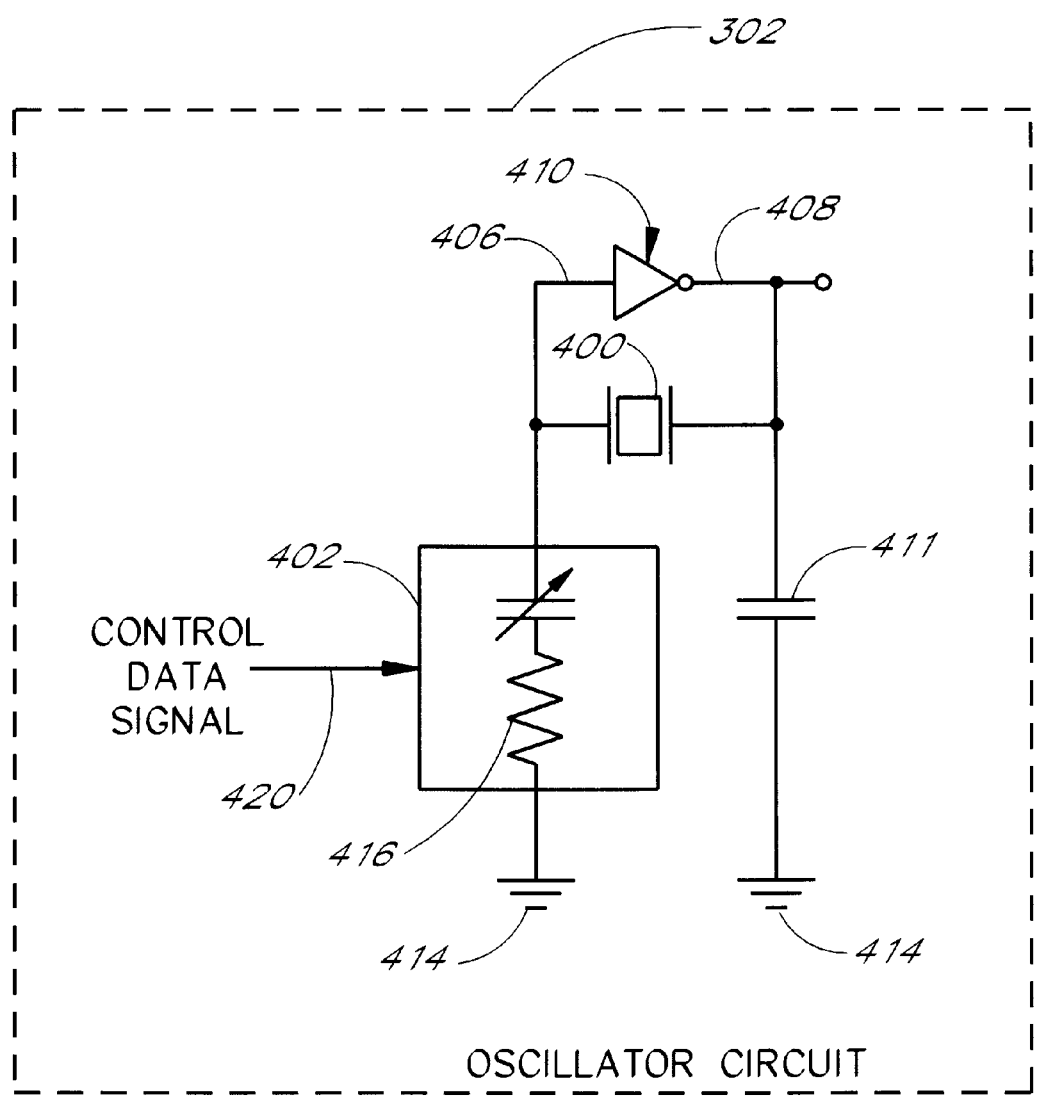
FIG. 4 is a schematic diagram of one embodiment of a tuning circuit.

FIG. 4 illustrates a schematic diagram of one embodiment of the oscillator circuit 302. In this embodiment, the oscillator circuit 302 includes a piezoelectric crystal 400, a variable capacitance array 402, an inverting amplifier 410 and a capacitor 411. The capacitor 411 and the variable capacitance array 402 define the load of the oscillator. The capacitor 411 and the variable capacitance array 402 vary the frequency of the piezoelectric crystal 400.

The piezoelectric crystal 400 is connected in parallel with the inverting amplifier 410. In one embodiment, the piezoelectric crystal is a quartz crystal. However, one of ordinary skill in the art will recognize that other embodiments may use a wide variety of piezoelectric substances. The piezoelectric crystal 400 is connected to an input 406 and an output 408 of the inverting amplifier 410.

In one embodiment, the inverting amplifier 410 is a field-effect transistor configured in a complementary-symmetry, metal-oxide semiconductor which is known to those of ordinary skill in the art. The output 408 of the inverting amplifier 410 is connected through the capacitor 411 to common ground 414. In addition, the output 408 of the inverting amplifier 410 is connected to the device circuitry 300 (not shown).

The input 406 of the inverting amplifier 410, on the other hand, is connected through the variable capacitance array 402 to common ground 414. The capacitance value of the variable capacitance array 402 is determined by a control data signal 420 discussed in further detail below. Also present is the inherent resistance of the variable capacitance array 402 which FIG. 4 depicts conceptionally as resistor 416.

While this embodiment describes a Pierce oscillator other oscillator configurations such as Colpitts and Clapp oscillators may also be used. Indeed, the invention described below can be implemented in a wide variety of devices which rely on linear and/or low-spread variable capacitance arrays. Furthermore the invention can be used as a means of calibration. For example, this invention could be used to tune on-chip timing circuits, transducers, automatic gain controls, phase-locked loops, on-chip continuous-time filters, etc.

B. Overview of the Variable Capacitance Array

Figure 5:
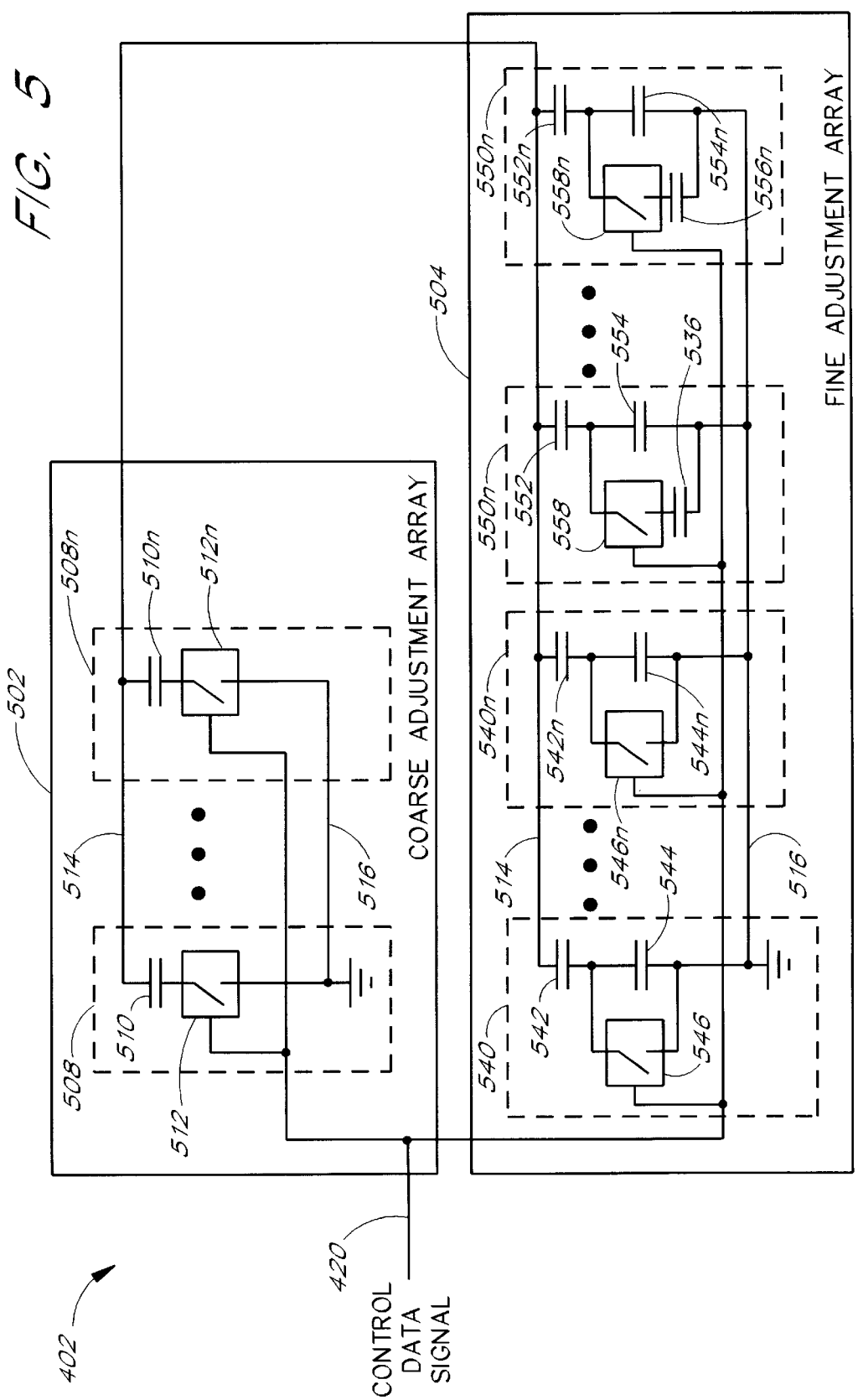
FIG. 5 is a schematic diagram of one embodiment of a variable capacitance array.

As shown in FIG. 5, the variable capacitance array 402 includes a coarse adjustment array 502 and a fine adjustment array 504. In one embodiment, the coarse adjustment array 502 is coupled in parallel with the fine adjustment array 504. The control data signal 420 controls the value of the capacitance in the coarse adjustment array 502 and the fine adjustment array 504.

As discussed in more detail below, the device circuitry 300 generates the control data signal 420. In one embodiment, the device circuitry 300 includes a continuous feedback loop which monitors the oscillations of the oscillator 400. When variations occur, the device circuitry 300 adjusts the value of the control data signal 420 to vary the value of the variable capacitance array 402. The new capacitance value then adjusts the operating frequency of the piezoelectric crystal 400.

In another embodiment, a circuit designer can preset the variable capacitance array 402 to a specific capacitance value. The specific capacitance value can be stored in hardware such as in a memory module. For example, a circuit designer can specify different preset values which correspond to different types of device circuitry 300.

In yet another embodiment, a circuit designer can preset the value of the coarse adjustment array 502. The device circuitry 300 can then periodically adjust the fine adjustment array 504 as needed. For example, a factory calibration procedure can preset the value of the coarse adjustment array 502 while the device circuitry 300 then periodically adjusts the fine adjustment array 504 during operation.

1 The Coarse Adjustment Array

In one embodiment, the course adjustment array 502 comprises multiple capacitance modules 508–508n which are coupled in parallel with each other. Throughout this description the "n" following a component numeral such as 508n, indicates that the number of components can be varied for different applications. Thus the number of capacitance modules 508–508n can be varied for different applications. The capacitance modules 508–508n respectively comprise at least one capacitor 510–510n and one switch 512–512n.

Each capacitor 510 is coupled to a common node 514. In addition, each capacitor 510 is coupled in series with a corresponding switch 512. Each switch, in turn, is coupled to common ground 516. Each switch 512 enables and disables its respective capacitance modules 508.

The control data signal 420 controls the switches 512. By controlling the switches 512, the control data signal 420 enables and disables the capacitance modules 508. The value of each enabled capacitance module 508 approximates the value of its associated capacitor 510. In contrast, the value of each non-enabled capacitance module 508 approximates zero.

Figure 6:
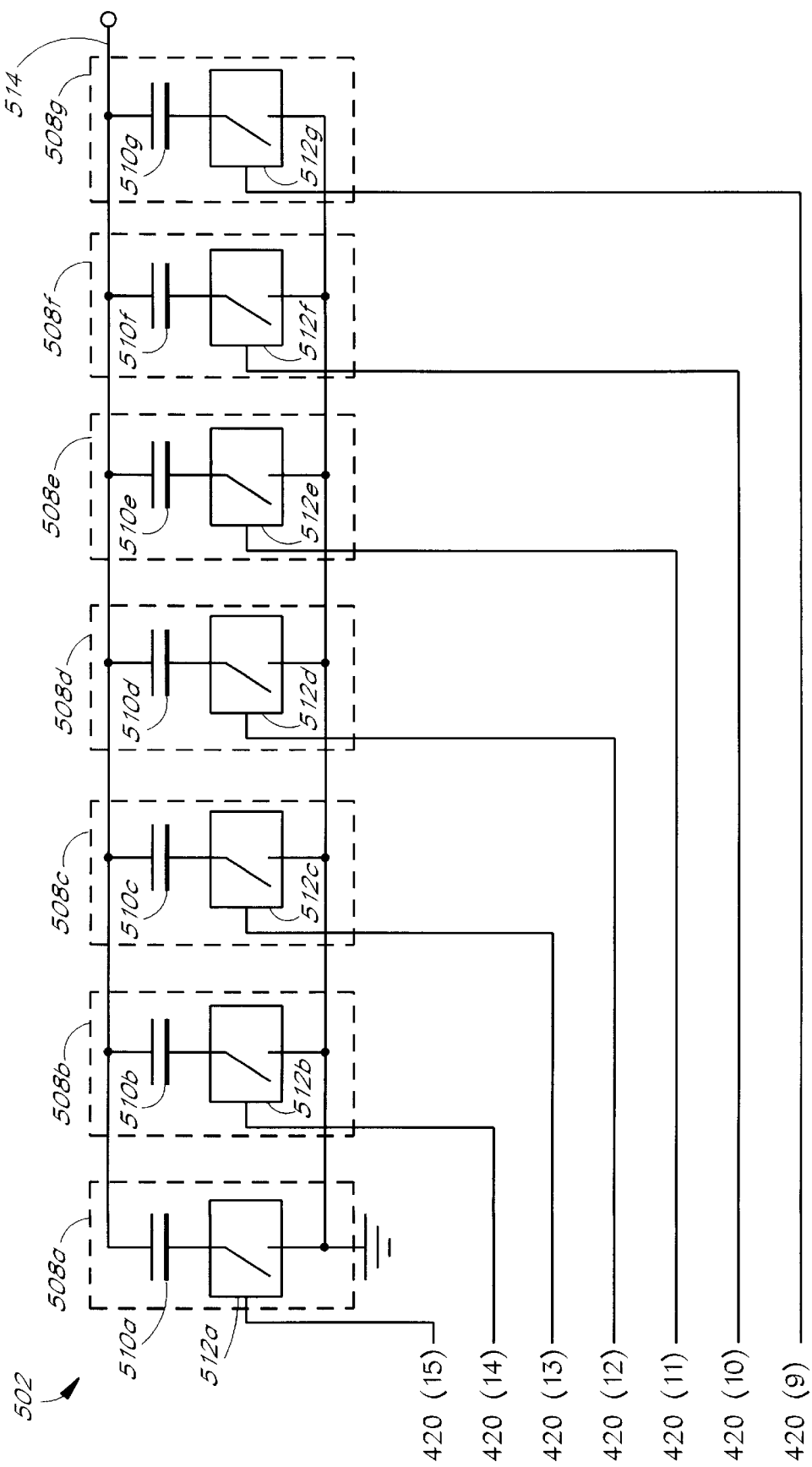
FIG. 6 is a schematic diagram of one embodiment of a coarse adjustment array.

As illustrated in FIG. 6, the coarse adjustment array 502 in one embodiment, has seven capacitance modules 508a–508g which act as a binary capacitance array. Beginning with capacitance module 508g, the capacitor 510g is approximately 0.125 (⅛) picofarads (pF). In capacitance module 508f the capacitor 510f is approximately 0.25 (¼) pF. In capacitance module 508e the capacitor 510e is approximately 0.5 (½) pF. In capacitance module 508d, the capacitor 510d is approximately 1.0 pF. In capacitance module 508c, the capacitor 510c is approximately 2.0 pF. In capacitance module 508b, the capacitor 510b is approximately 4.0 pF. In capacitance module 508a, the capacitor 510a is approximately 8.0 (pF). It is understood, however, that other embodiments can use different numbers of capacitance modules 508 and a wide range of different capacitors 510.

The control data signal 420 in this embodiment comprises 16 bits. The device circuitry 300 (not shown) uses the seven most significant bits of the control data signal 420(15)–420(9) to control the switches 512a–512g.

Beginning with capacitance module 508g, the control data signal 420(9) controls the switch 512g. The control data signal 420(10) controls the switch 512f. The control data signal 420(11) controls the switch 512e. The control data signal 420(12) controls the switch 512d. The control data signal 420(13) controls the switch 512c. The control data signal 420(14) controls the switch 512b. The control data signal 420(15) controls the switch 512a. In other embodiments, however, the control data signal 420 may vary in size and organization.

Because all of the capacitance modules 508 are placed in parallel, the total capacitance value of the coarse adjustment array 502 is the sum of the capacitance values of each enabled capacitance module 508a–508g. For example, assume that the most significant bits of the control data signal 420(15)–420(9) are binary 1100111. In this example, the seven most significant bits of the control data signal 420(15)–420(9) enable switches 512a, 512b, 512e, 512f and 512g and disable switches 512c and 512d. Accordingly, the total capacitance value for the course adjustment array is the sum of capacitance modules 508a+508b+508e+508f+508g (8.0 pF+4.0 pF+½ pF+¼ pF+⅛ pF) which equals approximately 12 and ⅞ pF.

The capacitance modules 508, 540 and 550 are implemented on a complementary metal-oxide semiconductor (CMOS) process. In other embodiments, the capacitance modules 508, 540 and 550 could be implemented with p-channel metal-oxide (PMOS), n-channel metal-oxide semiconductors (NMOS), bipolar, bipolar complementary metal-oxide semiconductors (BiCMOS), gallium arsenide semiconductors, or the like.

Figure 7:
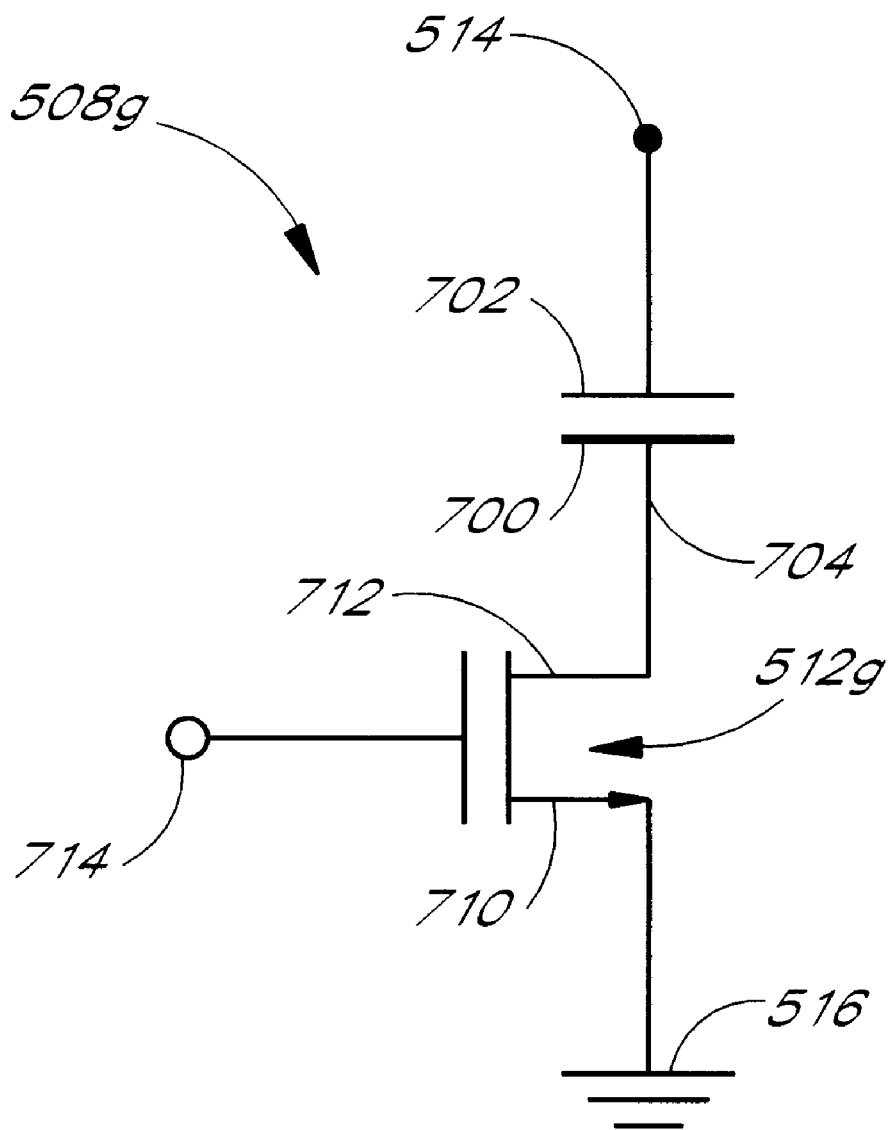
FIG. 7 is a schematic diagram of one embodiment of a capacitance module in the coarse adjustment array.

FIG. 7 illustrates the structure of the capacitance module 508g in one integrated circuit embodiment. The capacitor 510g comprises a first capacitor plate 700 and a second capacitor plate 702. The first capacitor plate 700 is polysilicon while the second capacitor plate 702 is a metal layer. The capacitor plates 700 and 702 are not limited to polysilicon and metal layers and can be implemented using well known capacitance technologies. In this embodiment, the value of the capacitor 510g is approximately ⅛ pF.

A connection line 704 couples the first capacitor plate 700 with the switch 512g. The connection line 704 is metal and exists in one or more of the semiconductor layers.

The switch 512g comprises a drain 710, a source 712 and a gate 714. In one embodiment, the switch 512g is implemented with an n-channel Metal Oxide Semiconductor Field Effect Transistor (MOSFET). The drain 710 and the source 712 are doped n-type diffusions on a doped p-type silicon substrate. The gate 714 is polysilicon exiting between the drain 710 and the source 712. The switch 512g, however, can be implemented with other types of transistors including a p-channel MOSFET, metal-semiconductor field-effect transistor (MESFET), a heterojunction bipolar transistor (HBT) or the like.

Figure 8:
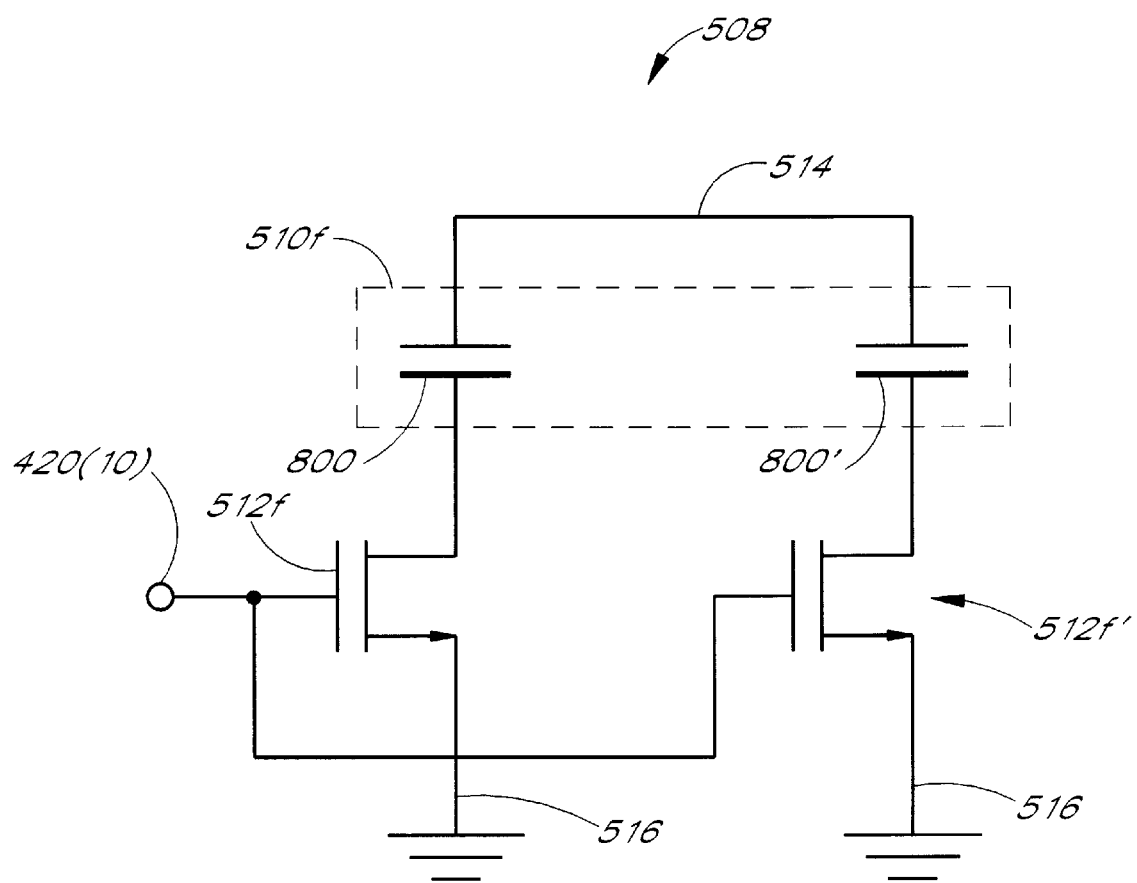
FIG. 8 is a schematic diagram of one embodiment of a capacitance module in the coarse adjustment array.

FIG. 8 illustrates the structure of capacitance module 508f in one integrated circuit embodiment. The capacitance module 508f and is essentially the combination of two capacitance modules 508g. The capacitor 510f is approximately ¼ pF. In one embodiment, the approximately ¼ pF value of capacitor 510f is a parallel combination of two approximately ⅛ pF capacitors 800. Thus, capacitance module 508f combines two approximately ⅛ pF capacitors 800 to create the approximately ¼ pF capacitor 510f.

In addition, the capacitance module 508f comprises a switch 512f and a second switch 512f'. The switches 512f and 512f' are similar in structure to the switch 512g. Furthermore, the connection line 704 in the capacitance module 508f is approximately twice the size of the connection line 704 in the capacitance module 508g. As discussed in more detail below, maintaining a consistent relationship among the number of capacitors 510 and 800, the number of switches 512 and the size of the connection line 704 improves the accuracy and precision of the variable capacitance array 402.

The structure of capacitance module 508e is essentially the combination of four capacitance modules 508g. In particular, the capacitor 510e is approximately ½ pF. In one embodiment, the approximately ½ pF value of capacitor 510e is a parallel combination of four ⅛ pF capacitors 800.

In addition, the capacitance module 508e comprises four switches 512e. Furthermore, the connection line 704 in the capacitance module 508e is approximately four times the size of the connection line 704 in the capacitance module 508g.

The structure of capacitance module 508d is essentially the combination of eight capacitance modules 508g. The capacitor 510d is approximately 1.0 pF. In one embodiment, the approximately 1.0 pF value of capacitor 510d is a parallel combination of eight ⅛ pF capacitors 800. In addition, the capacitance module 508d comprises eight switches 512d. Furthermore, the connection line 704 in the capacitance module 508d is approximately eight times the size of the connection line 704 in the capacitance module 508g.

The structure of capacitance module 508c is essentially the combination of sixteen capacitance modules 508g. The capacitor 510c is approximately 2.0 pF. In one embodiment, the 2.0 pF value of capacitor 510c is a parallel combination of sixteen ⅛ pF capacitors 800. In addition, the capacitance module 508c comprises sixteen switches 512c. Furthermore, the connection line 704 in the capacitance module 508c is approximately sixteen times the size of the connection line 704 in the capacitance module 508g.

The structure of capacitance module 508b is essentially the combination of thirty-two capacitance modules 508g. The capacitor 510b is approximately 4.0 pF. In one embodiment, the 4.0 pF value of capacitor 510b is a parallel combination of thirty-two ⅛ pF capacitors 800. In addition, the capacitance module 508b comprises thirty-two switches 512b. Furthermore, the connection line 704 in the capacitance module 508b is approximately thirty-two times the size of the connection line 704 in the capacitance module 508g.

The structure of capacitance module 508a is essentially the combination of sixty-four capacitance modules 508g. The capacitor 510a is approximately 8.0 pF. In one embodiment, the 8.0 pF value of capacitor 510a is a parallel combination of sixty-four ⅛ pF capacitors 800. In addition, the capacitance module 508a comprises sixty-four switches 512a. Furthermore, the connection line 704 in the capacitance module 508a is approximately sixty-four times the size of the connection line 704 in the capacitance module 508g.

As discussed in further detail below, one aspect of one embodiment of the invention is that the structures of the capacitance modules 508 are designed to maintain a constant ratio of parasitic capacitance. Parasitic capacitance is the extraneous capacitance which occurs in integrated circuit devices. The ratio of parasitic capacitance is held constant by maintaining a substantially constant relationship among the different components in the capacitance modules 508.

2. The Fine Adjustment Array

Returning to FIG. 5, the coarse adjustment array 502 and the fine adjustment array 504, in one embodiment, share the common node 514 and the common ground 516. The coarse adjustment array 502 and the fine adjustment array 504 are coupled in parallel. Accordingly, the total capacitive value of the variable capacitance array 402 is the sum of the course adjustment array 502 and the fine adjustment array 504.

The fine adjustment array 504 comprises multiple capacitance modules 540–540n and multiple capacitance modules 550–550n. The capacitance modules 540–540n comprise at least two capacitors while the capacitance modules 550–550n comprise at least three capacitors. Each of the capacitance modules 540–540n and 550–550n are connected in parallel with one another.

Focusing now on the capacitance modules 540–540n, the capacitance modules 540–540n comprise first capacitors 542–542n, second capacitors 544–544n and switches 546–546n. Each of the first capacitors 542 is coupled to the common node 514. In addition, each of the first capacitors 542 is coupled in series with a second capacitor 544 and in series with a switch 546.

Each of the second capacitors 544 and each of the switches 546 are connected to common ground 516. In addition, each of the second capacitors 544 and each of the switches 546 are connected in parallel with each other. The switches 546 either enable or disable the corresponding second capacitors 544.

As discussed in more detail below, if the control data signal 420 enables the switch 546, the second capacitor 544 is bypassed and the capacitance is approximately equal to the first capacitor 542. On the other hand, if the control data signal 420 does not enable the switch 546, the capacitance is determined by the series combination of the first capacitor 542 and the second capacitor 544.

Figure 9:
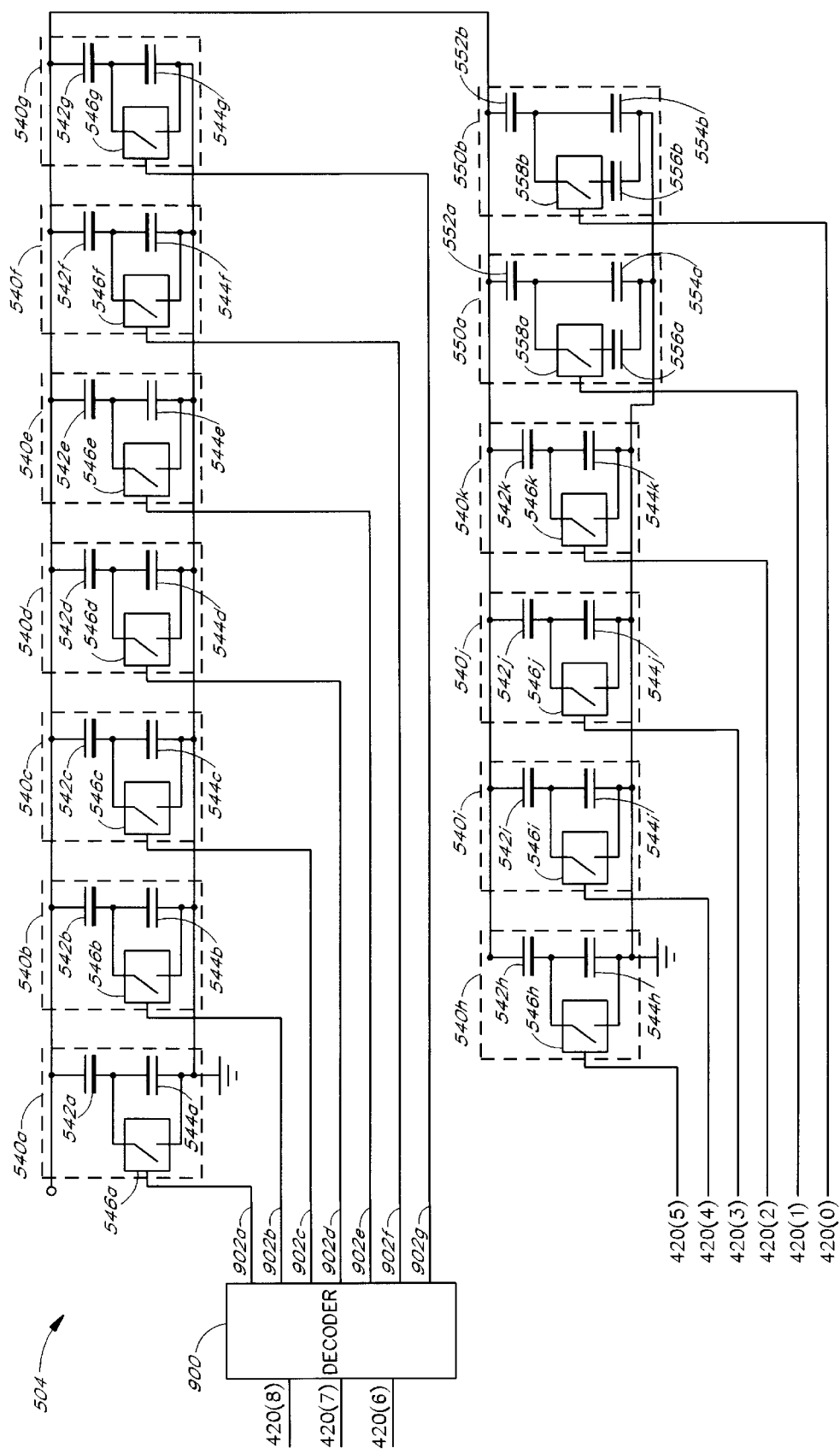
FIG. 9 is a schematic diagram of one embodiment of a fine adjustment array.

FIG. 9 illustrates a detailed schematic of one embodiment of the fine adjustment array 504. The fine adjustment array 504 in this embodiment comprises a decoder 900 and at least thirteen capacitance modules 540a–540k, 550a and 550b. Focusing now on capacitance modules 540a–540k, the capacitance modules 540a–540k comprise first capacitors 542a–542k, second capacitors 544a–544k and switches 546a–546k.

In capacitance modules 540a–540g, the first capacitors 542a–542g and the second capacitors 544a–544g are approximately ¼ pF. In capacitance module 540h, the first capacitor 542h and the second capacitor 544h are approximately ⅛ pF. In capacitance module 540i, the first capacitor 542i is approximately ⅛ pF and the second capacitor 544i is approximately ⅜ pF. In capacitance module 540j, the first capacitor 542j is approximately ⅛ pF and the second capacitor 544j is approximately ⅞ pF. In capacitance module 540k, the first capacitor 542k is approximately ⅛ pF and the second capacitor 544k is approximately 1 and ⅞ pF.

The decoder 900 receives three bits of the control data signal 420(8)–420(6) and outputs switch select signals 902a–902g. The switch select signals 902a–902g, in turn, control switches 546a–546g.

Table 1 illustrates one embodiment of the variations in the capacitance values of the fine adjustment array 504. The second row identifies bits 8-2 in the control data signal 420. The third row provides the capacitance value when a particular bit is asserted. The fourth row provides the capacitance value when a particular bit is not asserted. The fifth row provides the difference in capacitance values. For uniformity, the capacitance values are shown in fractions with a denominator of 512. Each value is in picofarads (pF).

TABLE 1

Capacitance Values (pF) Determined by The Control Data Signal 420 Bit 8 through Bit 2

| Bit | 420(8) | 420(7) | 420(6) | 420(5) | 420(4) | 420(3) | 420(2) |
|---|---|---|---|---|---|---|---|
| On | 512/512 | 256/512 | 128/512 | 64/512 | 64/512 | 58/512 | 57/512 |
| Off | 256/512 | 128/512 | 64/512 | 32/512 | 48/512 | 56/512 | 60/512 |
| Difference | 256/512 | 128/512 | 64/512 | 32/512 | 16/512 | 8/512 | 4/512 |

The control data signal 420(8) controls the switch select signals 902a–902d. For example, when the device circuitry 300 (not shown) asserts control data signal 420(8), the decoder 900 asserts switch select signals 902a–902d. The switch select signals 902a–902d, in turn, enable switches 546a–546d. While the decoder 900 generates a correspondence between control data signal 420(8) and switch select signals 902a–902d, in other embodiments, the decoder 900 may not exist, or may be designed to select different combinations of switch select signals 902a–902g in response to the control data signal 420.

When the device circuitry 300 asserts the control data signal 420(8) the value of each capacitance modules 540a–540d is the value of the first capacitor 542a–542d. In this example, each first capacitor 542a–542d is approximately ¼ pF. The total capacitance value added to the fine adjustment array 504 by control data signal 420(8) is the sum of the capacitance values in the capacitance modules 540a–540d which is approximately 1.0 pF (¼ pF+¼ pF+¼ pF+¼ pF). This is illustrated in the third row, second column as 512/512 pF.

When the device circuitry 300 does not assert the control data signal 420(8), the non-enabled switches 546a–546g respectively connect the first capacitors 542a–544g in series with the second capacitors 544a–544g. When each first capacitor 542a–542g is connected in series with each second capacitor 544a–544g, the value of each capacitance module 540a–540g approximates ⅛ pF. Thus, when the device circuitry does not assert the control data signal 420(8), the total capacitance added to the fine adjustment array 504 is approximately 0.5 pF (⅛ pF+⅛ pF+⅛ pF+⅛ pF). This is illustrated in the fourth row, second column as 256/512 pF.

Accordingly, the control data signal 420(8) can vary the value of the fine adjustment array 504 by approximately 0.5 pF from approximately 1.0 pF (when asserted) to approximately 0.5 pF (when not asserted). This is illustrated in the fifth row, second column as 256/512 pF.

Focusing now on the control data signal 420(7), the control data signal 420(7) controls the capacitance modules 540e and 540f. In this embodiment, the decoder 900 generates a correspondence between control data signal 420(7) and switch select signals 902e–902f. In other embodiments, the decoder 900 may not exist or the decoder 900 may be designed so that control data signal 420(7) selects different combinations of switch select signals 902a–902g.

When the device circuitry 300 asserts the control data signal 420(7), the value of capacitance module 540e is the value of the first capacitor 542e. Likewise, the value of capacitance module 540f is the value of the first capacitor 542f. In this example, each first capacitor 542e and 542f is approximately ¼ pF. Thus, the total capacitance value added to the fine adjustment array 504 by asserting the control data signal 420(7) is the sum of the capacitance values in the capacitance modules 540e and 540f which is approximately 256/512 pF.

When the device circuitry 300 does not assert the control data signal 420(7), the non-enabled switch 546e connects the first capacitor 542e in series with the second capacitor 544e. Likewise, the non-enabled switch 546f connects the first capacitor 542f in series with the second capacitor 544f. In this example, both the capacitance module 540e and the capacitance module 540f approximate 128/512 pF.

Thus, the total capacitance added to the fine adjustment array 504 by not asserting the control data signal 420(7) is approximately 128/512 pF. Accordingly, the control data signal 420(7) can vary the value of the fine adjustment array 504 by approximately 128/512 pF from approximately 256/512 pF (when asserted) to approximately 128/512 pF (when not asserted).

Focusing now on the control data signal 420(6), the control data signal 420(6) controls the value of the capacitance module 540g. In this embodiment, the decoder 900 generates a correspondence between control data signal 420(6) and switch select signal 902g. In other embodiments, the decoder 900 may not exist or the decoder 900 may be designed so that control data signal 420(6) selects different combinations of switch select signals 902a–902g.

When the device circuitry 300 asserts the control data signal 420(6), the value of the capacitance module 540g is the value of the first capacitor 542g. In this example, the first capacitor 542g is approximately 128/512 pF. Thus, the total capacitance value added to the fine adjustment array 504 by control data signal 420(6) is approximately 128/512 pF.

When the device circuitry 300 does not assert the control data signal 420(6), the non-enabled switch 546g connects the first capacitor 542g in series with the second capacitor 544g. Thus, the capacitance added to the fine adjustment array 504 by the non-asserted control data signal 420(6) is approximately 64/512 pF. Accordingly, the control data signal 420(6) can vary the value of the fine adjustment array 504 by approximately 64/512 pF from approximately 128/512 pF (when asserted) to approximately 64/512 pF (when not asserted).

Focusing now on the control data signal 420(5)–420(2), the control data signals 420(5)–420(2) respectively control the values of the capacitance modules 540h–540k. When the device circuitry 300 asserts the control data signal 420(5), the value of the capacitance module 540h is the value of the first capacitor 542h. In this example, the first capacitor 542h is approximately 64/512 pF. Thus, the total capacitance value added to the fine adjustment array 504 by control data signal 420(5) is approximately 64/512 pF.

When the device circuitry 300 does not assert the control data signal 420(5), the non-enabled switch 546h connects the first capacitor 542h in series with the second capacitor 544h. The capacitance added to the fine adjustment array 504 is approximately 32/512 pF. Accordingly, the control data signal 420(5) can vary the value of the fine adjustment array 504 by approximately 32/512 pF from approximately 64/512 pF (when asserted) to approximately 32/512 pF (when not asserted).

When the device circuitry 300 asserts the control data signal 420(4), the value of the capacitance module 540i is the value of the first capacitor 542i. In this example, the first capacitor 542i is approximately 64/512 pF. Thus, the total capacitance value added to the fine adjustment array 504 by control data signal 420(4) is approximately 64/512 pF.

When the device circuitry 300 does not assert the control data signal 420(4), the non-enabled switch 546i connects the first capacitor 542i in series with the second capacitor 544i. The capacitance added to the fine adjustment array 504 is approximately 48/512 pF. Accordingly, the control data signal 420(5) can vary the value of the fine adjustment array 504 by approximately 16/512 pF from approximately 64/512 pF (when asserted) to approximately 48/512 pF (when not asserted).

When the device circuitry 300 asserts the control data signal 420(3), the value of the capacitance module 540j is the value of the first capacitor 542j. In this example, the first capacitor 542j is approximately 64/512 pF. Thus, the total capacitance value added to the fine adjustment array 504 by control data signal 420(3) is approximately 64/512 pF.

When the device circuitry 300 does not assert the control data signal 420(3), the non-enabled switch 546j connects the first capacitor 542j in series with the second capacitor 544j. The capacitance added to the fine adjustment array 504 is approximately 56/512 pF. Accordingly, the control data signal 420(3) can vary the value of the fine adjustment array 504 by approximately 8/512 pF from approximately 64/512 pF (when asserted) to approximately 56/512 pF (when not asserted).

When the device circuitry 300 asserts the control data signal 420(2), the value of the capacitance module 540k is the value of the first capacitor 542k. In this example, the first capacitor 542k is approximately 64/512 pF. Thus, the total capacitance value added to the fine adjustment array 504 by control data signal 420(2) is approximately 64/512 pF.

When the device circuitry 300 does not assert the control data signal 420(2), the disabled switch 546k connects the first capacitor 542k in series with the second capacitor 544k and the capacitance added to the fine adjustment array 504 is approximately 60/512 pF. Accordingly, the control data signal 420(3) can vary the value of the fine adjustment array 504 by approximately 4/512 pF from approximately 64/512 pF (when asserted) to approximately 60/512 pF (when not asserted).

Figure 10A:
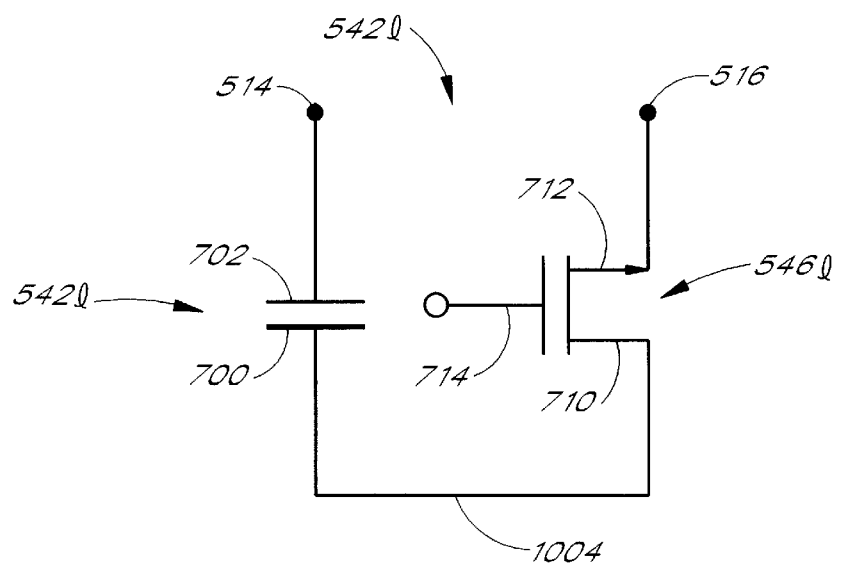
FIG. 10A is a schematic diagram of one embodiment of a capacitance module in the fine adjustment array.

FIG. 10A illustrates the structure of a capacitance module 540L. In one embodiment, the capacitance module 540L is used conceptionally to maintain a consistent relationship between the capacitance modules 540a–540h. As explained in further detail below, the invention controls the relationship or ratio between the value of the capacitors 542 and 544 and the value of the parasitic capacitance in each capacitance module 540. For example, the amount of parasitic capacitance is controlled by adding additional connection lines and by adding additional switches in series, parallel or some combination thereof.

The capacitance module 540L comprises a first capacitor 542L, a connection line 1004 and a switch 546L. The first capacitor 542L is approximately ⅛ pF and comprises a first capacitor plate 700 and a second capacitor plate 702. The first capacitor plate 700 is polysilicon while the second capacitor plate 702 is a metal layer.

The connection line 1004 interconnects the first capacitor plate 700 with the switch 546L. The connection line 1004 is metal and exists in one or more of the semiconductor layers. The switch 546L is similar in structure to the switches 512 and comprises a drain 710, a source 712 and a gate 714. The source 712 is connected to common ground 516 and the drain is connected to plate 700 of capacitor 542L.

Figure 10B:
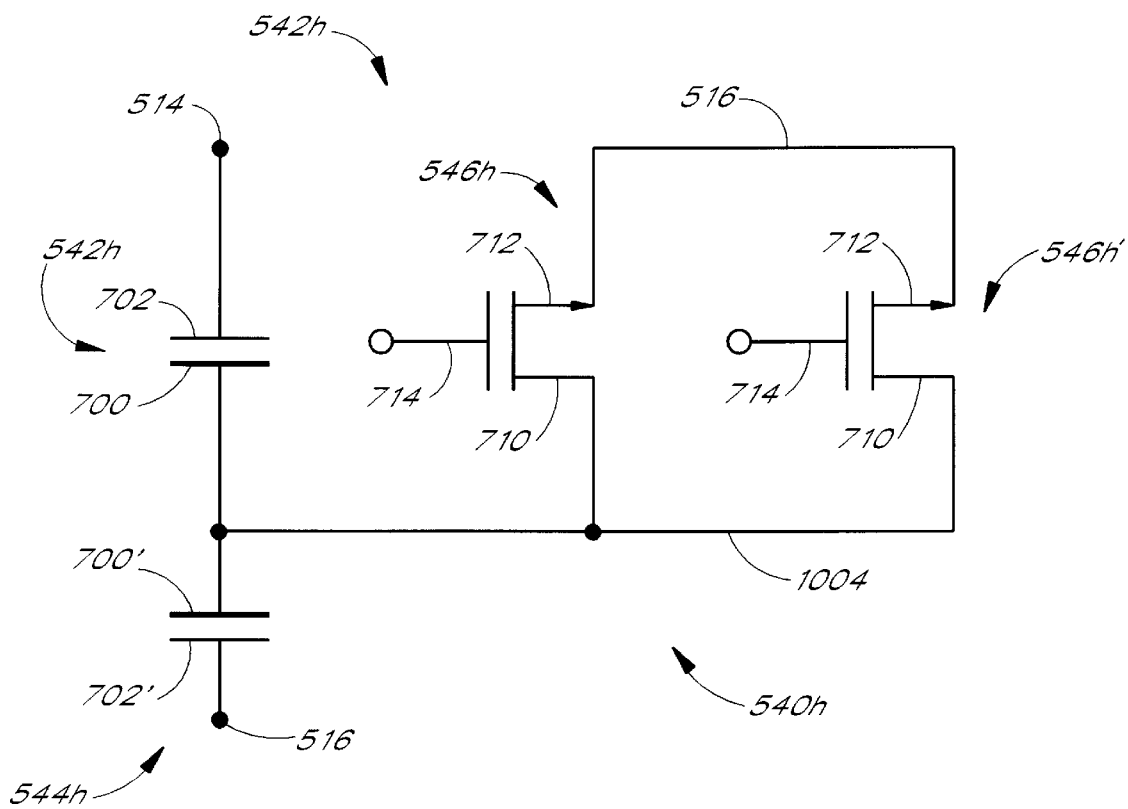
FIG. 10B is a schematic diagram of one embodiment of a capacitance module in the fine adjustment array.

FIG. 10B illustrates the structure of capacitance module 540h in one integrated circuit embodiment. The capacitance module 540h comprises the first capacitor 542h, the second capacitor 544h, a connection line 1004, the switch 546h and switch 546h'. The first capacitor 542h and the second capacitor 544h are approximately ⅛ pF each.

The first and second capacitors 542h and 544h comprise a first capacitor plate 700 and a second capacitor plate 702. The first capacitor plate 700 is polysilicon while the second capacitor plate 702 is a metal layer. By way of comparison, the capacitance module 540h has two approximately ⅛ pF capacitors 542h and 544h, twice the number of the approximately ⅛ pF capacitors 542L existing in capacitance module 540L.

The connection line 1004 interconnects the first capacitor plates 700 of the first and second capacitors 542h and 544h, the switch 546h and the switch 546h'. The connection line 1004 is metal and exists in one or more of the semiconductor layers. By way of comparison, the connection line 1004 in capacitance module 540h is approximately twice the size of the connection line 1004 existing in capacitance module 540L.

The switches 546h and 546h' are similar in structure to the switches 512. The switch 546h' is added to maintain a consistent relationship among the number of switches 546h and 546h', and the number of first and second capacitors 542h and 544h. Both the switch 546h and 546h' comprise a drain 710, a source 712 and a gate 714. In one embodiment, the switches 546h and 546h' are implemented with a MOSFET.

The drain 710 and the source 712 are doped n-type diffusions on a doped p-type silicon substrate. The gate 714 is polysilicon exiting between the drain 710 and the source 712. The switch 546h, however, can be implemented with other types of transistors including a MESFET, an HBT, or the like. By way of comparison, the capacitance module 540h has two switches 546h and 546h', twice the number of switches 546L existing in the capacitance module 540L.

Thus, the capacitance module 540h is structured to maintain a relatively consistent relationship among the number of first capacitors 542h, the number of second capacitors 544h, the number of switches 546h, the number of switches 546h' and the size of the connection line 1004.

Focusing now on capacitance modules 540a–540g, the integrated circuit structure of the capacitance modules 540a–540g is similar to the integrated circuit structure of capacitance module 540h depicted in FIG. 10. In one embodiment, the first capacitors 542a–542g and the second capacitors 544a–544g are approximately ¼ pF. The first capacitors 542a–542g are parallel combinations of two approximately ⅛ pF capacitors. In addition, the second capacitors 544a–544g are parallel combinations of two approximately ⅛ pF capacitors 800. Thus, each of the capacitance modules 540a–540g has four approximately ⅛ pF capacitors.

In addition, each of the capacitance modules 540a–540g comprises four switches 546a–546g. Furthermore, the connection line 1004 in each of the capacitance modules 540a–540g is approximately four times the size of the connection line 1004 in the capacitance module 540L.

Focusing now on capacitance module 540i, the first capacitor 542i is approximately ⅛ pF and the second capacitor 544i is approximately ⅜ pF. The first capacitor 542i is an approximately ⅛ pF capacitor while the second capacitor 544i comprises a parallel combination of three approximately ⅛ pF capacitors. Thus, the capacitance module 540i has four approximately ⅛ pF capacitors.

In addition, the capacitance module 540i comprises four switches 546i. Furthermore, the connection line 1004 in the capacitance module 540i is approximately four times the size of the connection line 1004 in the capacitance module 540L.

Focusing now on the integrated circuit structure of capacitance module 540j, the first capacitor 542j is approximately ⅛ pF and the second capacitor 544j is approximately ⅞ pF. The first capacitor 542j is an approximately ⅛ pF capacitor while the second capacitor 544j comprises a parallel combination of seven approximately ⅛ pF capacitors. Thus, the capacitance module 540j has eight approximately ⅛ pF capacitors.

In addition, the capacitance module 540j comprises eight switches 546j. Furthermore, the connection line 1004 in the capacitance module 540j is approximately eight times the size of the connection line 1004 in the capacitance module 540L.

Focusing now on the integrated circuit structure of capacitance module 540k, the first capacitor 542k is approximately ⅛ pF and the second capacitor 544k is approximately 1.875 pF. The first capacitor 542k is an approximately ⅛ pF capacitor while the second capacitor 544k comprises a parallel combination of fifteen approximately ⅛ pF capacitors. Thus, the capacitance module 540k has sixteen approximately ⅛ pF capacitors.

In addition, the capacitance module 540j comprises sixteen switches 546k. Furthermore, the connection line 1004 in the capacitance module 540k is approximately sixteen times the size of the connection line 1004 in the capacitance module 540L.

Returning now to FIG. 5 to focus on the capacitance modules 550–550n, the capacitance modules 550–550n comprise at least first capacitors 552–552n, second capacitors 554–554n, third capacitors 556–556n, and switches 558–558n. The first capacitor 552 is coupled to the common node 514, in series with the second capacitor 554 and in series with the third capacitor 556.

The second capacitor 544 is, in turn, connected to ground 516. The third capacitor 556, on the other hand, is coupled in series with the switch 558. Each switch 558 is, in turn, coupled to ground 516. Thus, the third capacitor 556 and the switch 558 are coupled in parallel with the second capacitor 554.

As discussed in more detail below, when the control data signal 420 enables the switch 558, the capacitance equals the combination of the first capacitor 552, the second capacitor 554, and the third capacitor 556. On the other hand, when the control data signal 420 disables the switch 558, the capacitance equals the combination of the first capacitor 552 and the second capacitor 554.

Referring now to FIG. 9, one embodiment contains two capacitance modules 550a and 550b. In capacitance module 550a, the first capacitor 552a is approximately ⅛ pF, the second capacitor 554a is approximately ⅞ pF and the third capacitor 556a is approximately ⅓ pF. The control data signal 420(1) controls the operation of the switch 558a.

In capacitance module 550b, the first capacitor 552b is approximately ⅛ pF. The second capacitor 554b is approximately ⅞ pF and the third capacitor 556b is approximately ⅐ pF. The control data signal 420(0) controls the operation of the switch 558b.

Figure 11:
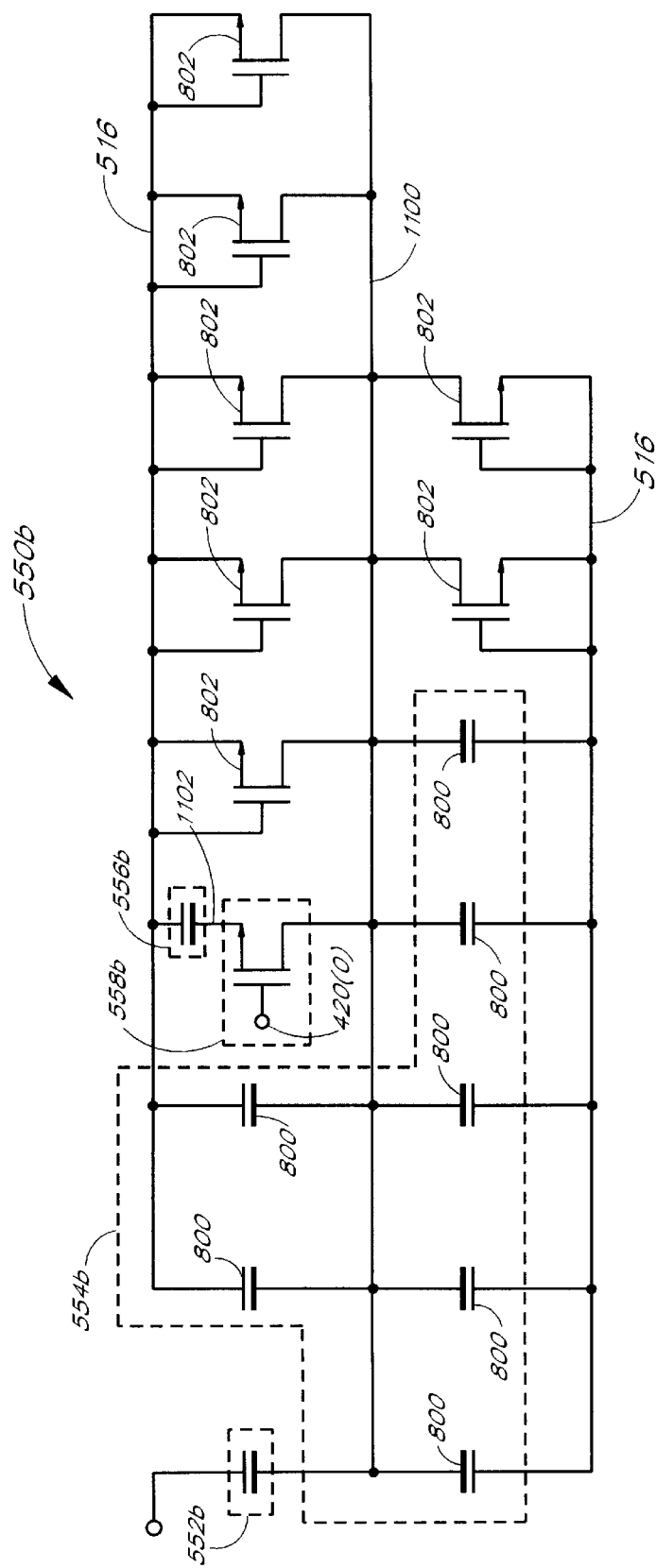
FIG. 11 is a schematic diagram of one embodiment of a capacitance module in the fine adjustment array.

FIG. 11 illustrates the integrated circuit structure in one embodiment of capacitance module 550b. The first capacitor 552b comprises an approximately ⅛ pF capacitor. The second capacitor 554b is approximately ⅞ pF and comprises seven approximately ⅛ pF capacitors 800 organized in parallel. When combined, the first capacitor 552b and the second capacitor 554b comprise eight approximately ⅛ pF capacitors 800, eight times the number of approximately ⅛ capacitors existing in capacitance module 508g. The third capacitor 556b is approximately ⅐ pF.

The capacitance module 550b also comprises a switch 558b and seven non-operational switches 802. The switch 558b and the seven non-operational switches 802 are similar in structure to the switches 512 and 546 discussed above. Thus, the capacitance module 550b has eight times the number of switches 558b and 802 when compared to the number of switches 546L existing in the capacitance module 540L.

The capacitance module 550b also comprises a first connection line 1100 and a second connection line 1102. The first connection line 1100 interconnects switch 558b, the non-operational switches 802 and the first, second and third capacitors 552b, 554b, and 556b. By way of comparison, the first connection line 1100 in the capacitance module 550b is eight times the size of the connection line 1004 in the capacitance module 540L.

The second connection line 1102 interconnects the third capacitor 556b to the switch 558b. Like the first connection line 1100, the second connection line 1102 is a metal layer.

By way of comparison, the second connection line 1102 is approximately ⁸⁄₇ times the size of the connection line 1004 in the capacitance module 540L.

TABLE 2

Capacitance Values (pF) Determined by The Control Data Signal 420(1)-420(0)

| Bit | 420(1) | 420(0) |
|---|---|---|
| On | 58/512 | 57/512 |
| Off | 56/512 | 56/512 |
| Difference | 2/512 | 1/512 |

Table 2 illustrates one embodiment of the variations in the capacitance values of the fine adjustment array 504. The second row identifies bits 1-0 in the control data signal 420. The third row provides the capacitance value when a particular bit is asserted. The fourth row provides the capacitance value when a particular bit is not asserted. The fifth row provides the difference in capacitance values. For uniformity, the capacitance values are shown in fractions with a denominator of 512. Each value is in picofarads (pF).

When the device circuitry 300 asserts the control data signal 420(0) the value of the capacitance module 550b is the combination of the first, second and third capacitors 552b, 554b and 556b. The first capacitor 552b is approximately ⅛ pF. The second capacitor 554b is approximately ⅞ pF and the third capacitor 556b is approximately ⅐ pF. Thus, the total capacitance added to the fine adjustment array 504 by the asserted control data signal 420(0) is approximately 57/512 pF.

When the device circuitry 300 does not assert the control data signal 420(0), the non-enabled switch 558b connects the first capacitor 552b in series with the second capacitor 544b. Thus, the capacitance added by the non-asserted control data signal 420(0) approximates 56/512 pF. Accordingly, the control data signal 420(0) can vary the value of the fine adjustment array 504 by approximately 1/512 pF from approximately 57/5125 pF (when asserted) to approximately 56/512 pF (when not asserted).

Figure 12:
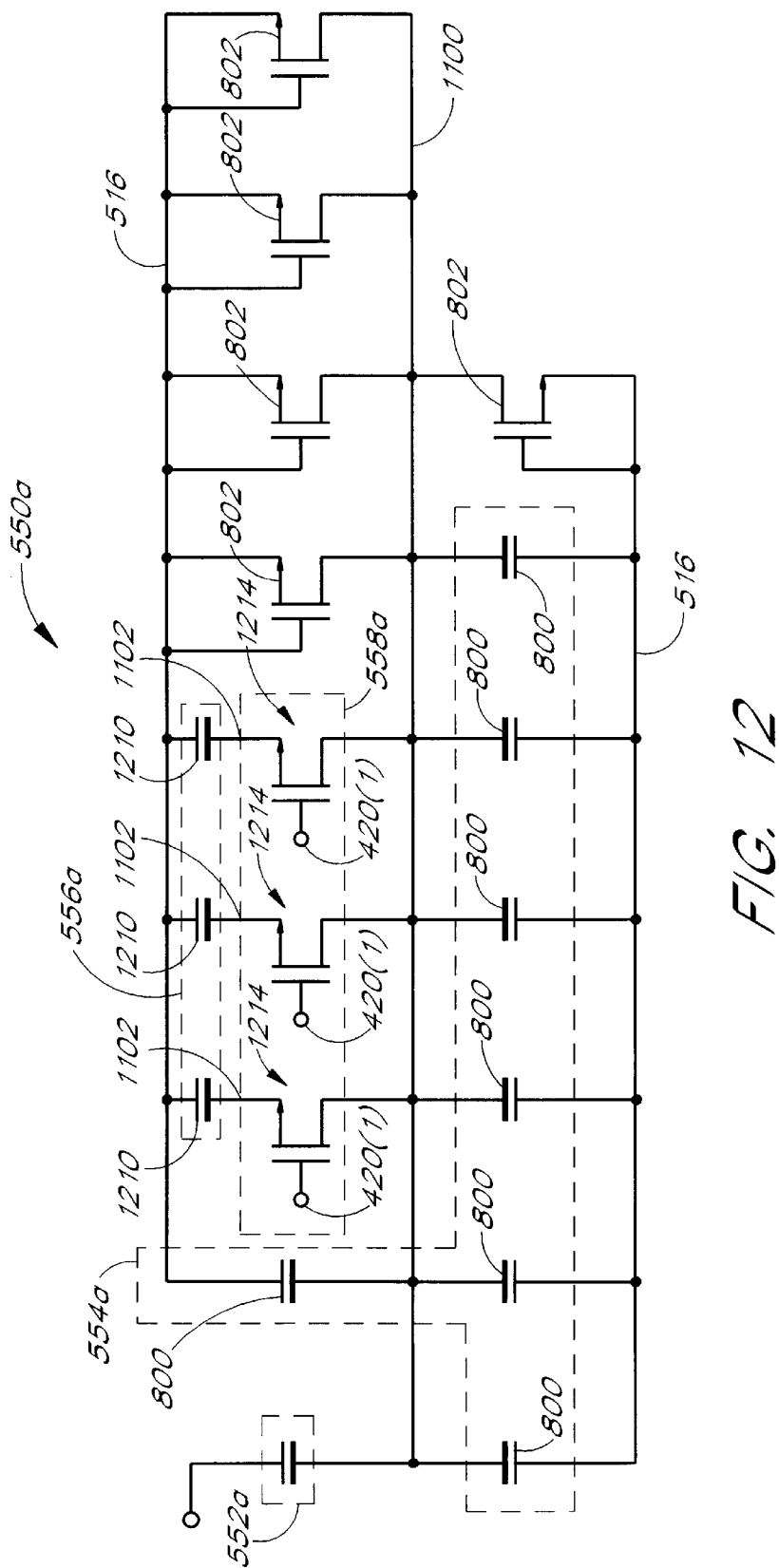
FIG. 12 is a schematic diagram of one embodiment of a capacitance module in the fine adjustment array.

FIG. 12 illustrates the integrated circuit structure of the capacitance module 550a. The first capacitor 552a comprises an approximately ⅛ pF capacitor. The second capacitor 554a is approximately ⅞ pF and comprises seven approximately ⅛ pF capacitors 800 organized in parallel. When combined, the first capacitor 552a and the second capacitor 554a comprise eight approximately ⅛ pF capacitors 800, eight times the number of approximately ⅛ capacitors existing in capacitance module 540L.

The third capacitor 556a comprises a parallel combination of two approximately ⅛ pF capacitors 1210 and one approximately ¹⁄₁₂ pF capacitor 1212. When combined in parallel, the two approximately ⅛ pF capacitors 1210 and the one approximately ¹⁄₁₂ pF capacitor 1212 equals approximately ⅓ pF. Thus, the third capacitor 556a is approximately ⅔ times the value of the capacitor 542L in the capacitance module 540L.

The switch 558a comprises a parallel combination of three switches 1214. Capacitance module 550a also comprises five non-operational switches 802. The switches 1214 and the five non-operational switches 802 are similar in structure to the switches 512 and 546 discussed above. Thus, the capacitance module 550a has eight times the number of switches 1214 and 802 when compared to the number of switches 546L existing in the capacitance module 540L.

The capacitance module 550a also comprises the first connection line 1100 and second connection lines 1102. The first connection line 1100 interconnects the switches 1214, non-operational switches 802, the first capacitor 552a, and the second capacitors 554 and 800. By way of comparison, the first connection line 1100 in the capacitance module 550a is eight times the size of the connection line 1004 in the capacitance module 540L.

The second connection lines 1102 comprise three segments which couple the capacitors 1210 and 1212 to the switches 1214. Like the first connection line 1100, the second connection lines 1102 comprise one or more metal layers. When combined, the three segments in the second connection lines 1102 are approximately 8/5 times the size of the connection line 1004 in the capacitance module 540L.

When the device circuitry 300 asserts the control data signal 420(1) the value of the capacitance module 550a is the combination of the first, second and third capacitors 552a, 554a and 556a. In this example, the combination of the first, second and third capacitors 552a, 554a and 556a approximate 58/512 pF.

When the device circuitry 300 does not assert the control data signal 420(1), the non-enabled switch 558a connects the first capacitor 552a in series with the second capacitor 544a. The value of the capacitance module 550a then approximates 56/512 pF. Accordingly, the control data signal 420(1) can vary the value of the fine adjustment array 504 by approximately 2/512 (pF) from approximately 58/512 pF (when asserted) to approximately 56/512 pF (when not asserted).

C. Matching the Parasitic Capacitances in the Coarse Array

The unique variable capacitance array 402 in one embodiment of the present invention is relatively precise to within a few femtofarads ($10^{-15}$ farads). Indeed, the least significant bit of the variable capacitance array 402 adjusts the value of the fine adjustment array 504 by as little as approximately 1.953 fF. One obstacle in achieving this level of accuracy in integrated circuit devices is what is called component matching.

In addition to component matching, another obstacle is parasitic capacitance. Parasitic capacitance is the extraneous capacitance which occurs in integrated circuit devices. Unlike most discrete components, an integrated circuit comprises a group of densely packed components on multiple layers of material. The proximity of the components and the configuration of the layers produce extraneous (i.e., parasitic) capacitance.

In addition, parasitic capacitance varies when the structures of the different semiconductor layers vary and also with the signal (voltage dependent junction capacitances). By way of example, parasitic capacitance exists between the plates of the capacitors 510a–510g and other layers of material in the semiconductor. In addition, parasitic capacitance exists between the connection lines 704 which and other layers of material in the semiconductor. Furthermore, parasitic capacitance exists between the switching junctions existing in different switches 512a–512g.

One embodiment controls in each capacitance module 508a–508g, the relationship or ratio between the value of the capacitors 510 and the value of the parasitic capacitance in each capacitance module 512. For example, the amount of parasitic capacitance is controlled by adding additional connection lines 704 and by adding additional switches 512 in series, parallel or some combination thereof. As a result, when compared to discrete components, the variable capacitance array 402 provides high-linearity, low spread, improved response to power fluctuations, while reducing power dissipation and manufacturing costs.

Figure 13:
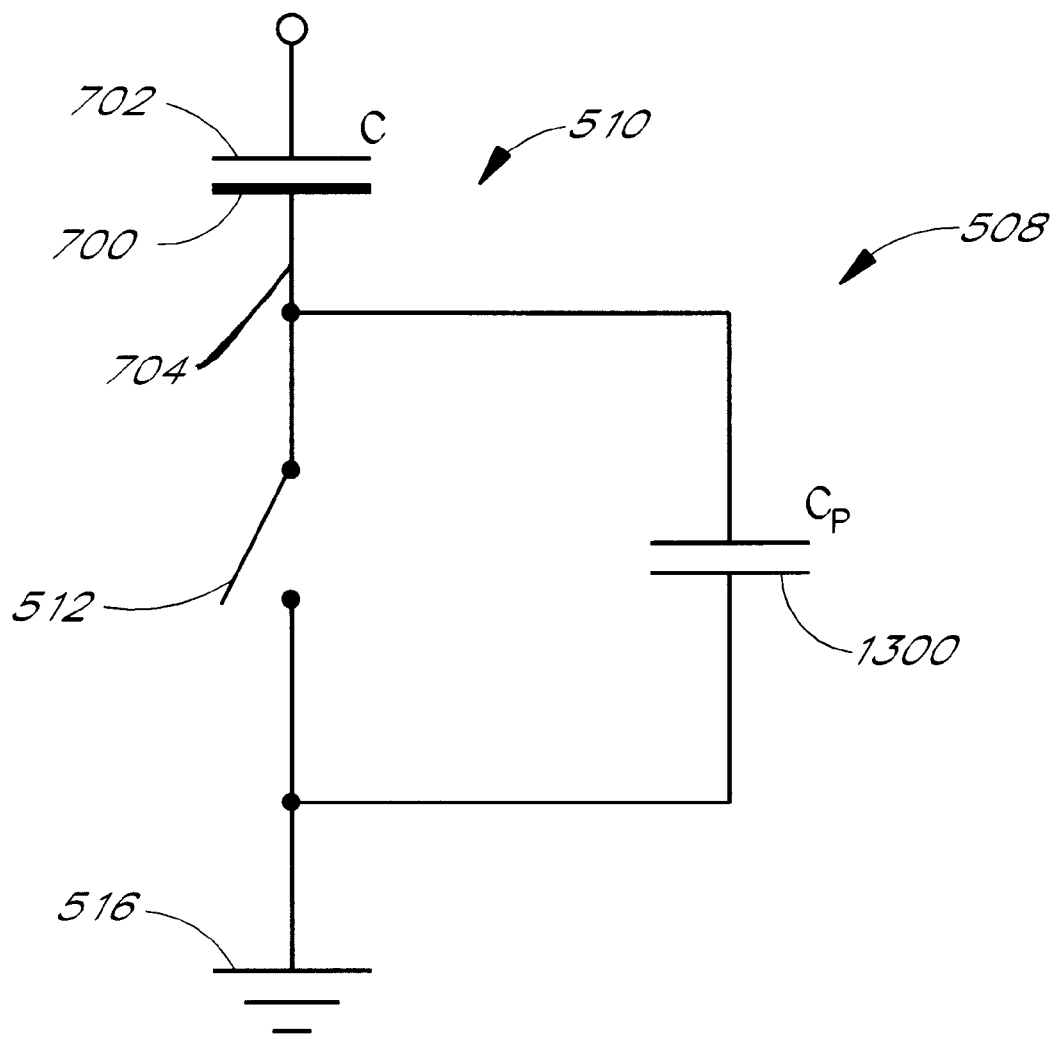
FIG. 13 is a conceptional block diagram of the parasitic capacitance in one of the capacitance modules.

FIG. 13 illustrates the conceptional representation of the parasitic capacitance existing in the capacitance modules 508–508n. As explained above, in each capacitance module 508, the capacitor 510 is connected in series with a switch 512, which in turn, is connected to ground 516. In one embodiment, the capacitor 510 is connected to switch 512 via the connection line 704.

The parasitic capacitance existing in capacitance module 508 is represented conceptionally as a parasitic capacitor 1300 which is connected in parallel with switch 512. Throughout this detailed description, the parasitic capacitor 1300 is also referred to as the parasitic capacitance 1300 or with the symbol Cp. As discussed in further detail below, in one embodiment, the parasitic capacitance 1300 represents the parasitic capacitance associated with the capacitor 510, the parasitic capacitance associated with the connection line 704, and the parasitic capacitance associated with the switches 512. In other embodiments, the parasitic capacitance Cp may include additional components added to the capacitance modules 508. In yet other embodiments where the capacitance modules 508 comprise different elements, the parasitic capacitance may not include the parasitic capacitance from the switches 512 or the connection lines 704.

As discussed above, the capacitor 510 comprises at least the first capacitor plate 700 and the second capacitor plate 702. The parasitic capacitance from the capacitor 510 is referred to as the $C_{pCapPlate}$ (not shown) and exists between the first capacitor plate 700 and primarily the substrate as well as other layers in the semiconductor. The parasitic capacitance between the second capacitor plate 702 and the semiconductor substrate, however, is relatively negligible because of the separation between the two.

Parasitic capacitance also exists between the switches 512 and other layers of the semiconductor. The parasitic capacitance from the switches 512 is referred to as the $C_{pSwitch}$ (not shown). Furthermore, parasitic capacitance exists between the connection line 704 and other layers in the semiconductor. The parasitic capacitance from the connection line 704 is referred to as the $C_{pConnection}$ (not shown).

The parasitic capacitance 1300, Cp, of the capacitance module 508 comprises the parasitic capacitance from the capacitor 510 ($C_{pCapPlate}$), the parasitic capacitance from the switches 512 ($C_{pSwitch}$), and the parasitic capacitance from the connection line 704 ($C_{pConnection}$). Thus, the parasitic capacitance Cp of the capacitance module 508 is represented mathematically as:

$$C_p = C_{pCapPlate} + C_{pConnection} + C_{pSwitch}$$

Table 3 sets forth the capacitance values of the capacitance module 508 under both ideal and actual conditions. The second column of Table 1 provides the value of the capacitance module 508 under ideal conditions where there are no parasitic capacitances. The third column of Table 1 provides the value of the capacitance module 508 in actual conditions where parasitic capacitances exist.

When the control data signal 420 enables the switch 512 under ideal conditions, as shown in the second column, second row, the value of the capacitance module 508 equals the value of the capacitor 510. The value of the capacitor 510 is referred to as "C" in the mathematical equations. As shown in the second column, third row, when the control data signal 420 does not enable the switch 512, the value of the capacitance module 508 is zero farads. Thus, as shown in the second column, fourth row, the difference in capacitance, Δ under ideal conditions is C minus zero which equals C.

TABLE 3

| | IDEAL | ACTUAL |
|---|---|---|
| SWITCH ON | C | C |
| SWITCH OFF | Zero | $\frac{CC_p}{C+C_p}$ or $C - \frac{C^2}{C_p+C}$ |
| Difference Δ | C | $C\left(1 - \frac{C_p}{C}\right)$ |

The third column shows the value of the capacitance under real operating conditions. As shown in the third column, second row, when the control data signal 420 does enable switch 512 the value of the capacitance module 508 is C. Alternatively, when the control data signal does not enable switch 512 the value of the capacitance module 508 is the following combination of the capacitor C and parasitic capacitance Cp:

$$\frac{CC_p}{C+C_p} = C - \frac{C^2}{C_p+C}$$

This equation represents the value of the combination of the Capacitor C and parasitic capacitance Cp. The first order approximation of the difference in the capacitance when the control data signal 420 enables and disables the switch 512 under actual conditions is:

$$\Delta_{actual} = C\left(1 - \frac{C_p}{C}\right)$$

The difference between $\Delta_{ideal}$ and $\Delta_{actual}$ is Cp.

One embodiment of the present invention accounts for the parasitic capacitance Cp existing in the capacitance modules 508a–508g with a technique referred to as matching. Matching relies on the ratio of parasitic capacitance Cp and capacitance C. Throughout this detailed description, the ratio of the parasitic capacitance Cp to the capacitance C is called the "parasitic ratio" and is represented by the alpha symbol α.

One embodiment of the present invention obtains accurate values of capacitance by maintaining similar parasitic ratios in the capacitance modules 508a–508g. Although the semiconductor processes may vary from chip to chip, the parasitic ratios on a single chip remain substantially consistent. That is, the relationship of the parasitic ratios in each capacitance module 508a–508g remain approximately the same value.

In one embodiment, the parasitic ratios in the different capacitance modules 508a–508g are substantially similar. The variation in the parasitic ratio is determined in part by the variation in the value of the capacitors 510a–510g and the variation in the value of the parasitic capacitance Cp. In one embodiment, the variation between the capacitors 510a–510g (matching) is approximately 0.2 percent. In other embodiments, the capacitors 510a–510g vary by less than 0.2 percent. In still other embodiments, the capacitors 510a–510g vary by more than 0.2 percent.

In one embodiment, the variation between the values of the parasitic capacitance Cp of the different capacitance modules 508a–508g is approximately 10 percent. In other embodiments, the parasitic capacitance Cp varies less than 10 percent. In still other embodiments, the parasitic capacitance Cp of the difference capacitance modules 508a–508g varies more than 10 percent.

The capacitance module 508g has one approximately ⅛ pF capacitor 510g which is represented as C. As discussed above, the capacitance module 508g has parasitic capacitance from the approximately ⅛ pF capacitor, the switch 512g and the connection line 704. The parasitic ratio, α, is represented mathematically as:

$$\alpha = \frac{C_p}{C}$$

or $$\alpha C = C_p$$

The capacitance module 508f is set to approximately the same parasitic ratio relationship as capacitance module 508g. The capacitor 510f is implemented with two approximately ⅛ pF capacitors 800 organized in parallel to create the approximately ¼ pF capacitor 510f. In addition, capacitance module 508f comprises two switches 512f. Still further, the connection line 704 in the capacitance module 508f is approximately twice the size of the connection line 704 in the capacitance module 508g.

Accordingly, capacitance module 508g is designed to have twice the parasitic capacitance 2Cp and twice the capacitance 2C. As shown in the following equation, the parasitic ratio α of the capacitance module 508f is approximately the same as the parasitic ratio of the capacitance module 508g:

$$\alpha = \frac{2C_p}{2C} = \frac{C_p}{C}$$

Likewise, the parasitic ratios of capacitance module 508a–508e are set to approximately the same values as the capacitance modules 508f and 508g. In particular, the capacitance module 508e is designed to have four times the parasitic capacitance 4Cp and four times the capacitance 4C. The capacitance module 508d is designed to have eight times the parasitic capacitance 8Cp and eight times the capacitance 8C.

The capacitance module 508c is designed to have sixteen times the parasitic capacitance 16Cp and sixteen times the capacitance 16C. The capacitance module 508b is designed to have thirty-two times the parasitic capacitance 32Cp and thirty-two times the capacitance 32C. The capacitance module 508a is designed to have sixty-four times the parasitic capacitance 64Cp and sixty-four times the capacitance 64C.

D. Matching the Parasitic Capacitances in the Fine Array

One embodiment of the present invention also accounts for the parasitic capacitance Cp existing in the fine adjustment array 504 with matching. For example, the capacitance modules 540a–540k have parasitic ratio relationships which are similar.

One embodiment controls in each capacitance module 540a–540k, the relationship or parasitic ratio between the value of the capacitors 542 and 544 and the value of the parasitic capacitance. For example, the amount of parasitic capacitance is controlled by adding additional connection lines 1004 and by adding additional switches 546 in series, parallel or some combination thereof. As a result, when compared to discrete components, the variable capacitance array 402 provides high linearity, low spread, improved response to power fluctuations, while reducing power dissipation and manufacturing costs.

Figure 14:
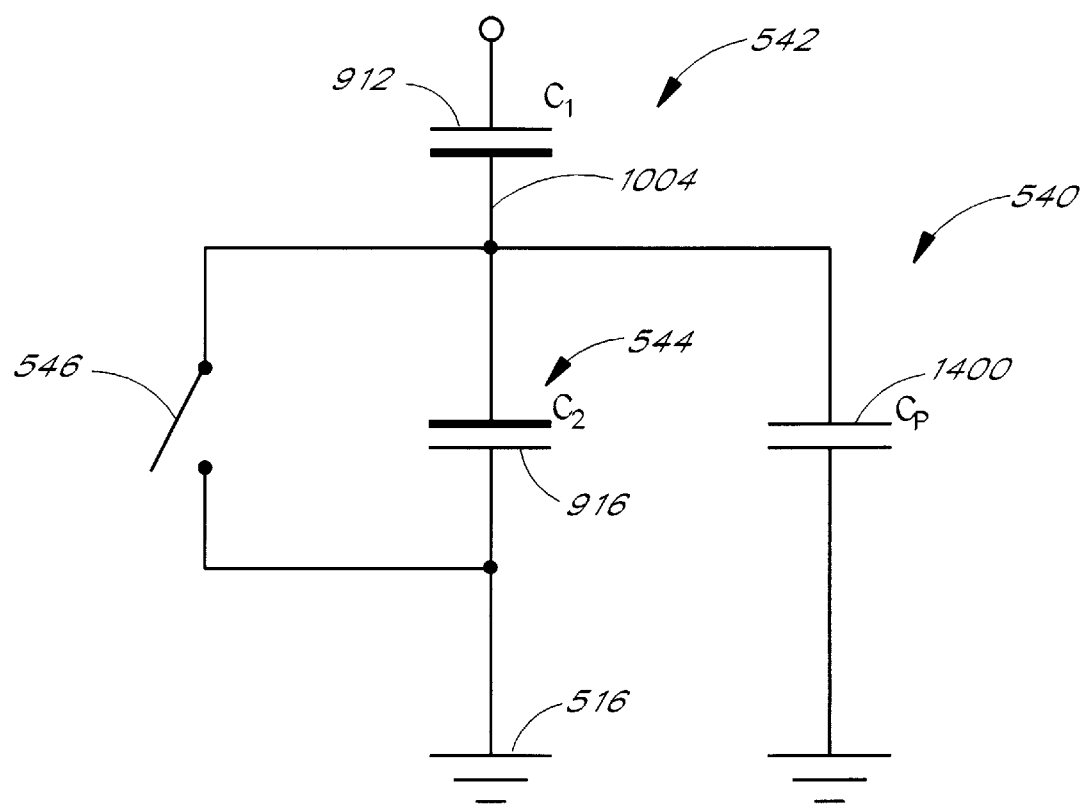
FIG. 14 is a conceptional block diagram of the parasitic capacitance in one of the capacitance modules.

FIG. 14 illustrates the conceptional representation of the parasitic capacitance Cp existing in the capacitance modules 540a–540k. As explained above, the first capacitor 542 is connected in series with the second capacitor 544 and in series to the switch 546. The switch 546 and the second capacitor 544, are in turn, connected to ground 516.

The value of the first capacitor 542 is referred to as "C1", value of the second capacitor 544 is referred to as "C2". The parasitic capacitance in the capacitance module 540 is represented conceptionally with the parasitic capacitor 1400 which is connected in parallel with switch 546 and second capacitor 544. Throughout this detailed description, the parasitic capacitance is also identified with the symbol Cp. In one embodiment, the parasitic capacitance 1400 represents the parasitic capacitance associated with the first capacitor 542, the parasitic capacitance associated with the second capacitor 544, the parasitic capacitance associated with the connection line 1004, and the parasitic capacitance associated with the switches 546. In other embodiments, the parasitic capacitance may include components added to the capacitance modules 540. In yet other embodiments where the capacitance modules 540 comprise different elements, the parasitic capacitance Cp may not include the parasitic capacitance from the switches 546 or the connection lines 1004.

As discussed above, in one embodiment, both the first capacitor 542 and the second capacitor 544 comprise at least the first capacitor plate 700 and at least the second capacitor plate 702. The parasitic capacitance of the first capacitor 542 is referred to as the $C_{pFirstCapPlate}$ and exists between the first capacitor 542 and primarily the substrate as well as other layers in the semiconductor. The parasitic capacitance for the second capacitor 544 is referred to as the $C_{pSecondCapPlate}$ and exists between the second capacitor 544 and primarily the substrate as well as other layers in the semiconductor. The parasitic capacitance between the second capacitor plates 702 and the semiconductor substrate, however, is relatively negligible because of the separation between the two.

Parasitic capacitance also exists between the switch 546 and other layers of the semiconductor. The parasitic capacitance from the switches 546 is referred to as the $C_{pSwitch}$. In addition, parasitic capacitance exists between connection line 1004 and other layers in the semiconductor. The parasitic capacitance from the connection line 1004 is referred to as the $C_{pConnection}$.

The parasitic capacitance, Cp, of the capacitance module 540 thus comprises the parasitic capacitance from the first capacitor 542 ($C_{pFirstCapPlate}$), the parasitic capacitance from the second capacitor 544 ($C_{pSecondCapPlate}$), the parasitic capacitance from the switches 546 ($C_{pSwitch}$), and the parasitic capacitance from the connection line 1004 ($C_{pConnection}$). Thus, the parasitic capacitance Cp of the capacitance module 540 is represented mathematically as:

$$C_p = C_{pFirstCapPlate} + C_{pSecondCapPlate} + C_{pConnection} + C_{pSwitch}$$

Table 4 sets forth the capacitance values of the capacitance module 540 under both ideal and actual conditions.

The second column of Table 4 provides the value of the capacitance module 540 under ideal conditions where there are no parasitic capacitances. The third column of Table 4 provides the value of the capacitance module 540 in actual conditions where parasitic capacitances exist.

TABLE 4

|  | IDEAL | ACTUAL |
|---|---|---|
| SWITCH ON | $C_1$ | $C_1$ |
| SWITCH OFF | $\dfrac{C_1 C_2}{C_1 + C_2}$ or $C_1 - \dfrac{C_1^2}{C_1 + C_2}$ | $\dfrac{C_1(C_2 + C_p)}{C_1 + C_2 + C_p}$ or $C_1 - \dfrac{C_1^2}{C_1 + C_2 + C_p}$ |
| Difference Δ | $\dfrac{C_1^2}{C_1 + C_2}$ | $\dfrac{C_1^2}{C_1 + C_2}\left(1 - \dfrac{C_p}{C_1 + C_2}\right)$ |

When the control data signal 420 enables the switch 542 under ideal conditions, as shown in the second column, second row, the value of the capacitance module 540 equals the value of the first capacitor C1 542. As shown in the second column, third row, when the control data signal 420 does not enable switch 546, the value of the capacitance module 540 is:

$$\frac{C_1 C_2}{C_1 + C_2} = C_1 - \frac{C_1^2}{C_1 + C_2}$$

When the control data signal 420 enables the switch 546 and disables the switch 546 the capacitance varies. As shown in the second column, fourth row, the difference in capacitance, Δ, under ideal conditions is:

$$\Delta_{ideal} = \frac{C_1^2}{C_1 + C_2}$$

Column 3 illustrates the capacitive values under real operating conditions. As shown in the third column, second row, when the control data signal 420 enables the switch 546, the value of the capacitance module 508 is the value of the first capacitor C1 542. Alternatively, as shown in the third column, third row, when the control data signal does not enable the switch 546, the value of the capacitance module 508 is the combination of the first capacitor C1 542, the second capacitor C2 544 and the parasitic capacitance Cp:

$$\frac{C_1(C_2 + C_p)}{C_1 + C_2 + C_p} = C_1 - \frac{C_1^2}{C_1 + C_2 + C_p}$$

A first order approximation of the difference in capacitance values Δ when the control data signal 420 enables and disables the switch 546 under actual conditions is:

$$\Delta_{actual} = \frac{C_1^2}{C_1 + C_2}\left(1 - \frac{C_p}{C_1 + C_2}\right)$$

The difference between $\Delta_{ideal}$ and $\Delta_{actual}$ is:

$$\frac{C_1^2 C_p}{(C_1 + C_p)^2}$$

One embodiment of the present invention obtains accurate values by setting the parasitic ratio relationships in the capacitance modules 540a–540k to be substantially similar. The variation between the parasitic ratios is determined in part by the variation between the values of the capacitors 542a–542k, 544a–544k and the variation between the values of the parasitic capacitance Cp.

In one embodiment, the variation between the capacitors 542a–542k and 544a–544k is approximately 0.2 percent. In other embodiments, the capacitors 542a–542k and 544a–544k vary by less than 0.2 percent. In still other embodiments, the capacitors 542a–542k and 544a–544k vary by more than 0.2 percent.

In one embodiment, the variation between the parasitic capacitance Cp of the different capacitance modules 540a–540k is approximately 10 percent. In other embodiments, the parasitic capacitance Cp varies less than 10 percent. In still other embodiments, the parasitic capacitance Cp of the difference capacitance modules 540a–540k varies more than 10 percent.

In the capacitance modules 540a–540k, the parasitic ratio is set to:

$$\alpha = \frac{C_p}{C_1 + C_2}$$

or $$C_p = \alpha(C_1 + C_2)$$

For example, in the capacitance inodure 540h the first capacitor C1 542h and the second capacitor C2 544h are approximately ⅛ pF. Accordingly, the capacitance module 540h has two approximately ⅛ pF capacitors, twice the number of the approximately ⅛ capacitor 542L existing in capacitance module 540L.

In addition, the capacitance module 540h has two switches, the switch 546h and the switch 546h'. Still further, the connection line 1004 in the capacitance module 540h is twice the size of connection line 1004 existing in capacitance module 540L. Accordingly, the capacitance module 540h has twice the parasitic capacitance 2Cp as the parasitic capacitance Cp in capacitance module 540L.

As shown in the following equation, the parasitic ratio α of the capacitance module 540h is designed to be approximately the same as the parasitic ratio of the capacitance module 540L:

Likewise, the parasitic ratios of capacitance modules 540a–540g and 540i–540k are designed to have similar parasitic ratios. The capacitance modules 540a–540g and $$\alpha = \frac{2C_p}{C_1 + C_2} = \frac{2C_p}{2C} = \frac{C_p}{C}$$

540i are designed to have approximately four times the parasitic capacitance 4Cp and four times the capacitance 4C. The capacitance module 540j is designed to have eight times the parasitic capacitance 8Cp and eight times the capacitance 8C. The capacitance module 540k is designed to have sixteen times the parasitic capacitance 16Cp and sixteen times the capacitance 16C.

Figure 15:
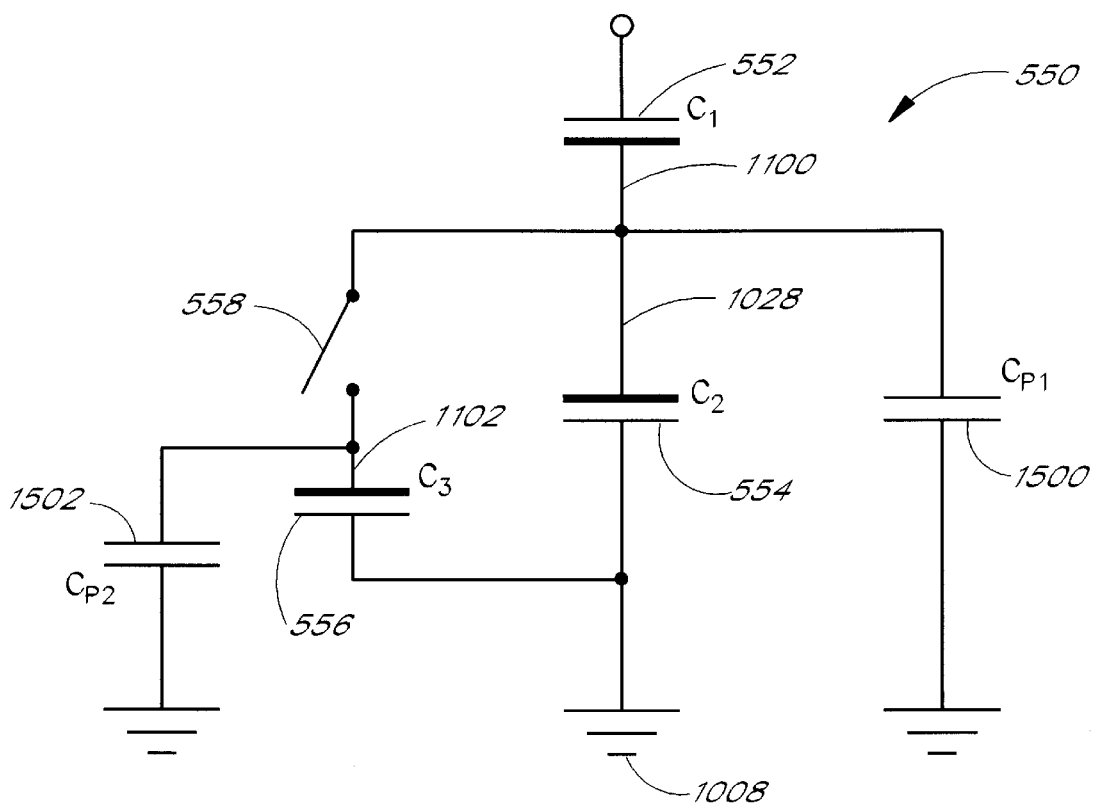
FIG. 15 is a conceptional block diagram of the parasitic capacitance in one of the capacitance modules.

FIG. 15 illustrates a conceptional representation of the parasitic capacitance in the capacitance module 550. As discussed above, each capacitance module 550 includes the first capacitor 552, the second capacitor 554, the third capacitor 556, and the switch 558. The first capacitor 552 is identified with the symbol C1, the second capacitor 553 is identified with the symbol C2 and the third capacitor 556 is identified with the symbol C3.

Unlike the capacitance modules 508 and 540, the parasitic capacitance in capacitance module 550 is depicted with a first parasitic capacitor 1500 and a second parasitic capacitor 1502. Throughout this description, the first parasitic capacitance represented by the first parasitic capacitor 1500 is referred to at times as the first parasitic capacitance Cp1, while the second parasitic capacitance represented by the second parasitic capacitor 1502 is referred to at times with the symbol Cp2.

One embodiment controls in each capacitance module 550a and 550b, the relationship or parasitic ratios for the first parasitic capacitance Cp1 and the second parasitic capacitance Cp2. For example, the amount of parasitic capacitance is controlled by adding additional connection lines 1100, 1102 and by adding additional switches 802 in series, parallel or some combination thereof.

In one embodiment, the first parasitic capacitor 1500 represents the parasitic capacitance from the first capacitor C1, the parasitic capacitance from the first capacitor C1 552, the parasitic capacitance from the second capacitor C2 554, the parasitic capacitance from the first connection line 1100, and the parasitic capacitance of switch 558 and switches 802. In other embodiments, the first parasitic capacitance Cp1 may include components added to the capacitance modules 550. In yet other embodiments where the capacitance modules 550 comprise different elements, the first parasitic capacitance Cp1 may not include the parasitic capacitance from the switches 558, 802 or the connection lines 1100.

As discussed above, in one embodiment, both the first capacitor 552 and the second capacitor 554 comprise at least the first capacitor plate 700 and at least the second capacitor plate 702. The parasitic capacitance of the first capacitor 552 is referred to as the $C_{pFirstCapPlate}$ and exists between the first capacitor 552 and primarily the substrate as well as other layers in the semiconductor. The parasitic capacitance for the second capacitor 554 is referred to as the $C_{pSecondCapPlate}$ and exists between the second capacitor 554 and primarily the substrate as well as other layers in the semiconductor. The parasitic capacitance between the second capacitor plates 702 and the semiconductor substrate, however, is relatively negligible because of the separation between the two.

Parasitic capacitance also exists between the switch 558 and other layers of the semiconductor. The parasitic capacitance from the switch 558 and the non-operational switches 802 is referred to as the $C_{p1Switch}$. In addition, parasitic capacitance exists between the first connection line 1100 and other layers in the semiconductor. The parasitic capacitance from the first connection line 1100 is referred to as the $C_{p1Connection}$.

The first parasitic capacitance, Cp1, of the capacitance module 550 thus comprises the parasitic capacitance from the first capacitor C1 552 ($C_{pFirstCapPlate}$), the parasitic capacitance from the second capacitor C2 554 ($C_{pSecondCapPlate}$), the parasitic capacitance from the switch 558 and the switches 802 ($C_{p1Switch}$), and the parasitic capacitance from the first connection line 1100 ($C_{p1Connection}$). Thus, the first parasitic capacitance Cp1 of the capacitance module 550 is represented mathematically as:

$C_{p1} = C_{pFirstCapPlate} + C_{pSecondCapPlate} + C_{p1Connection} + C_{p1Switch}$ The second parasitic capacitor 1502 is represented as being in parallel with the third capacitor C3 556. In one embodiment, the second parasitic capacitor 1502 represents the parasitic capacitance from the third capacitor C3 556, the second connection line 1002 and the switch 558. In other embodiments, the second parasitic capacitance Cp2 may include components added to the capacitance modules 550. In yet other embodiments where the capacitance modules 550 comprise different elements, the second parasitic capacitance Cp2 may not include the parasitic capacitance from the switches 558, 802 or the connection lines 1100.

As discussed above, in one embodiment, the third capacitor 556 comprises at least the first capacitor plate 700 and at least the second capacitor plate 702. The parasitic capacitance from the third capacitor 556 is referred to as the $C_{pThirdCapPlate}$ and exists between the third capacitor 556 and primarily the substrate as well as other layers in the semiconductor. The parasitic capacitance between the second capacitor plates 702 and the semiconductor substrate, however, is relatively negligible because of the separation between the two.

In addition, parasitic capacitance exists between the second connection line 1102 and other layers in the semiconductor. The parasitic capacitance from the second connection line 1102 is referred to as the $C_{p2Connection}$. Parasitic capacitance also exists between the switch 558 and other layers of the semiconductor. The parasitic capacitance from the switch 558 is referred to as the $C_{p2Switch}$. In one embodiment, $C_{p2Switch}$ does not include the parasitic capacitance from the switches 802.

The second parasitic capacitance, Cp2, of the capacitance module 550 thus comprises the parasitic capacitance from the third capacitor C3 556 ($C_{pThirdCapPlate}$), the parasitic capacitance from the switch 558 ($C_{p2Switch}$), and the parasitic capacitance from the second connection line 1102 ($C_{p2Connection}$). The second parasitic capacitance Cp2 of the capacitance module 550 is represented mathematically as:

$C_{p2} = C_{pThirdCapPlate} + C_{p2Connection} + C_{p2Switch}$

Table 5 sets forth the capacitance values of the capacitance module 550 under ideal conditions. The second column of Table 5 provides the value of the capacitance module 550 under ideal conditions where there are no parasitic capacitances.

TABLE 5

| | IDEAL |
|---|---|
| SWITCH ON | $\dfrac{C_1(C_2 + C_3)}{C_1 + C_2 + C_3}$ or $C_1 - \dfrac{C_1^2}{C_1 + C_2 + C_3}$ |
| SWITCH OFF | $\dfrac{C_1 C_2}{C_1 + C_2}$ or $C_1 - \dfrac{C_1^2}{C_1 + C_2}$ |
| Difference Δ | $C_1^2 \left( \dfrac{1}{C_1 + C_2} - \dfrac{1}{C_1 + C_2 + C_3} \right)$ |

The second column of Table 5 shows the capacitance of the capacitance modules 550 under ideal conditions. As shown in the second column, second row, when the control data signal 420 enables the switch 558, the value of the capacitance module 540 is the combination of the first capacitor C1 552, the second capacitor C2 554 and the third capacitor C3 556:

$$\dfrac{C_1(C_2 + C_3)}{C_1 + C_2 + C_3} = C_1 - \dfrac{C_1^2}{C_1 + C_2 + C_3}$$

As shown in the second column, third row, when the control data signal 420 does not enable the switch 558, the value of the capacitance module 550 is the combination of the first capacitor C1 552 and the second capacitor C2 554:

$$\dfrac{C_1 C_2}{C_1 + C_2} = C_1 - \dfrac{C_1^2}{C_1 + C_2}$$

As shown in the second column, fourth row, the difference in capacitance, Δ when the control data signal 420 enables and disables the switch 558 is:

$$\Delta_{ideal} = C_1^2 \left( \dfrac{1}{C_1 + C_2} - \dfrac{1}{C_1 + C_2 + C_3} \right)$$

TABLE 6

| | ACTUAL |
|---|---|
| SWITCH ON | $\dfrac{C_1(C_2 + C_3 + C_{P_1} + C_{P_2})}{C_1 + C_2 + C_3 + C_{P_1} + C_{P_2}}$ or $C_1 - \dfrac{C_1^2}{C_1 + C_2 + C_3 + C_{P_1} + C_{P_2}}$ |
| SWITCH OFF | $\dfrac{C_1(C_2 + C_{P_1})}{C_1 + C_2 + C_{P_1}}$ or $C_1 - \dfrac{C_1^2}{C_1 + C_2 + C_{P_1}}$ |
| Difference Δ | $C_1^2 \left[ \dfrac{1}{C_1 + C_2} - \dfrac{C_{P_1}}{(C_1 + C_2)^2} - \dfrac{1}{C_1 + C_2 + C_3} + \dfrac{C_{P_1} + C_{P_2}}{(C_1 + C_2 + C_3)^2} \right]$ |

Table 6 sets forth the capacitance values of the capacitance module 550 under real conditions. The second column of Table 6 provides the value of the capacitance module 550 in actual conditions where the first parasitic capacitance Cp1 and the second parasitic capacitance Cp2 exist As shown in the second column, second row, when the control data signal 420 enables the switch 558, the value of the capacitance module 550 is the combination of the first capacitor C1 552, the second capacitor C2 554, the third capacitor C3 556, the first parasitic capacitance Cp1 and the second parasitic capacitance Cp2:

$$\dfrac{C_1(C_2 + C_3 + C_{p_1} + C_{p_2})}{C_1 + C_2 + C_3 + C_{p_1} + C_{p_2}} = C_1 - \dfrac{C_1^2}{C_1 + C_2 + C_3 + C_{p_1} + C_{p_2}}$$

Alternatively, as shown in the second column, third row, when the control data signal does not enable switch 558, the value of the capacitance is the combination of the first capacitor C1 552, the second capacitor C2 554 and the first parasitic capacitance Cp1:

$$\frac{C_1(C_2 + C_{p_1})}{C_1 + C_2 + C_{p_1}} = C_1 - \frac{C_1^2}{C_1 + C_2 + C_{p_1}}$$

As shown in the second column, fourth row, the first order approximation of the difference in capacitance Δ under actual conditions is:

$$\Delta_{actual} = C_1^2 \left[ \frac{1}{C_1 + C_2} - \frac{C_{p_1}}{(C_1 + C_2)^2} - \frac{1}{C_1 + C_2 + C_3} + \frac{C_{p_1} + C_{p_2}}{(C_1 + C_2 + C_3)^2} \right]$$

The difference between $\Delta_{ideal}$ and $\Delta_{actual}$ is $$\frac{C_1^2 C_{p_1}}{(C_1 + C_2)^2} - \frac{C_1^2(C_{p_1} + C_{p_2})}{(C_1 + C_2 + C_3)^2}$$

One embodiment of the invention sets the parasitic ratio relationships in the capacitance modules 550a and 550b to be similar to the parasitic ratios in the capacitance modules 540a–540k. The variation between the parasitic ratios is determined in part by the variation between the values of the capacitors 552a, 552b, 554a, 554b, 556a, 556b, the variation between the values of the first parasitic capacitanes Cp1, and the variation between the values of the second parasitic capacitances Cp2.

In one embodiment, the variation between the capacitors 552a, 552b, 554a, 554b, 556a and 556b is approximately 0.2 percent. In other embodiments, the capacitors 552a, 552b, 554a, 554b, 556a and 556b vary by less than 0.2 percent. In still other embodiments, the capacitors 552a, 552b, 554a, 554b, 556a and 556b vary by more than 0.2 percent.

In one embodiment, the variation between the first parasitic capacitances Cp1 of the capacitance modules 550a and 550b is approximately 10 percent. In other embodiments, the first parasitic capacitance Cp1 varies less than 10 percent. In still other embodiments, the first parasitic capacitance Cp1 of the capacitance modules 550a and 550b varies more than 10 percent. In the capacitance modules 550a and 550b, the first parasitic capacitance parasitic ratio α1 is set to:

$$\alpha_1 = \frac{C_{p1}}{C_1 + C_2}$$

or $$C_{p1} = \alpha_1(C_1 + C_2)$$

For example, in the capacitance module 550b the first capacitor C1 552b comprises one approximately ⅛ pF. The second capacitor C2 554b is approximately ⅞ pF. Accordingly, combined capacitance of the first capacitor C1 552b and the second capacitor C2 554b approximates 1.0 pF or eight times the capacitance (8C) as the capacitance in capacitance module 540L.

In addition, the capacitance module 550b has eight switches, the switch 558b and the switches 802. Thus, the capacitance module 550b has eight times the number of switches 558b and 802 when compared to the number of switches 546 in the capacitance module 540L. Still further, the first connection line 1100 is eight times the size of the connection line 1004 existing in capacitance module 540L. Accordingly, the first parasitic capacitance Cp1 in capacitance module 550b is about eight times (8Cp1) as the parasitic capacitance Cp in capacitance module 540L.

As shown in the following equation, the first parasitic ratio α1 is designed to be approximately the same as the parasitic ratio of the capacitance module 540L:

$$\alpha_1 = \frac{8C_{p1}}{C_1 + C_2} = \frac{8C_{p1}}{8C} = \frac{C_p}{C}$$

In one embodiment, the variation between the second parasitic capacitances Cp2 of the capacitance modules 550a and 550b is approximately 10 percent. In other embodiments, the second parasitic capacitance Cp2 varies less than 10 percent. In still other embodiments, the second parasitic capacitance Cp2 of the capacitance modules 550a and 550b varies more than 10 percent. The second parasitic capacitance parasitic ratio α2 is set to:

$$\alpha_2 = \frac{C_{p2}}{C_3}$$

or $$C_{p2} = \alpha_2 C_3$$

For example, in the capacitance module 550b the third capacitor C3 556b comprises one approximately ⅐ pF. Accordingly, the capacitance of the third capacitor C3 556b is approximately 8/7 times the value of the capacitance in capacitance module 540L.

The capacitance module has one switch 558h. Still further, the second connection line 1100 is approximately 8/7 times the size of the connection line 1004 existing in capacitance module 540L. Accordingly, the second parasitic capacitance Cp2 is about 8/7 times the parasitic capacitance Cp in capacitance module 540L.

As shown in the following equation, the second parasitic ratio α2 of the first parasitic capacitance module 540h is designed to be approximate the parasitic ratio of the capacitance module 540L:

$$\alpha_2 = \frac{1.143 C_{p2}}{1.143 C_3} = \frac{C_p}{C}$$

Likewise, the first and second parasitic ratios of capacitance module 540a are designed to be similar. For the first parasitic ratio α1, the capacitance module 550a is designed to have approximately the same amount of the first parasitic capacitance Cp1. In addition, the capacitance module 550a is designed to have approximately the same combined amount of capacitance in the first capacitor C1 552a and the second capacitor C2 554a.

To maintain a relatively consistent second parasitic ratio α2, the third capacitor C3 556a is approximately ⅗ times the amount of capacitance when compared to the amount of capacitance in the capacitance module 540L. In addition, capacitance module 550a is designed to have approximately ⅗ times the amount of second parasitic capacitance Cp2 when compared to the amount of parasitic capacitance Cp in the capacitance module 540L.

Thus, one embodiment of the present invention obtains accurate values of capacitance by maintaining similar parasitic ratios in the capacitance modules 540 and 550. Although the semiconductor processes may vary from chip to chip, the parasitic ratios on a single chip remain substantially consistent. That is, the relationship of the parasitic ratios in each of the capacitance modules 540 and 550 remain similar. As a result, when compared to other variable capacitor arrays, the balanced parasitic capacitance in the variable capacitance array 402 provides high linearity, low spread, improved response to power fluctuations, while reducing power dissipation and manufacturing costs.

E. Conclusion

While the above detailed description has shown, described and pointed out the fundamental novel features of the invention as applied to a preferred embodiment, it will be understood that various omissions, substitutions and changes in the form, and details of the illustrated device may be made by those skilled in the art without departing from the spirit of the invention. Consequently, the scope of the invention should not be limited to the foregoing discussion but should be defined by the appended claims.

What is claimed is:

1. A method of providing a variable capacitance comprising:
   providing a first capacitance value which differs from a second capacitance value;
   defining a relationship between said first capacitance value and a first parasitic capacitance value; and
   maintaining a similar relationship between said second capacitance value and a second parasitic capacitance value by increasing said second parasitic capacitance with at least one capacitive element.

2. The method of claim 1 wherein said maintaining a similar relationship increases said second parasitic capacitance with at least one non-operational switch.

3. The method of claim 1 wherein said maintaining a similar relationship increases said second parasitic capacitance by increasing the size of a connection line.

4. The method of claim 1 wherein said maintaining a similar relationship increases said second parasitic capacitance with at least one operational switch.

5. The method of claim 1 wherein said maintaining a similar relationship increases said second parasitic capacitance with at least one operational connection line.

6. An apparatus for providing capacitance within an integrated circuit comprising:
   a first capacitance value, a second capacitance value and a third capacitance value, wherein said second capacitance value is coupled in series with said first capacitance value and wherein said third capacitance value is coupled in parallel with said second capacitance value;
   at least one switch which is coupled to said third capacitance value;
   a first parasitic capacitance value comprising parasitic capacitance associated with said switch and said first, second and third capacitance values; and
   a second parasitic capacitance value comprising parasitic capacitance associated with said switch and said third capacitance value, wherein the ratio of said second parasitic capacitance value to said third capacitance value is similar to the ratio of said first parasitic capacitance value to said first, second and third capacitance values.

7. The apparatus of claim 6 wherein said switch selectively enables said third capacitance value.

8. The apparatus of claim 6 wherein said first capacitance value has a first set of capacitors associated therewith.

9. The apparatus of claim 6 wherein said second capacitance value has a second set of capacitors associated therewith.

10. The apparatus of claim 6 wherein said third capacitance value has a third set of capacitors associated therewith.

11. A wireless communications device having an operating frequency which can be varied with a variable capacitor, said wireless communications device comprising:
    wireless communications circuitry which is configured to transmit and receive data;
    an oscillator in communication with said wireless communications circuitry, said oscillator configured to generate a frequency signal which alters the operation of said wireless communications circuitry, said oscillator further configured to vary said frequency signal in response to different capacitance values;
    a first capacitance module in communication with said oscillator, said first capacitance module comprising a first capacitance value, a first switch and a first parasitic capacitance value;
    a second capacitance module in communication with said first capacitance module, said second capacitance module comprising a second capacitance value, a second switch, and a second parasitic capacitance value, wherein said second capacitance value is different in magnitude than said first capacitance value and wherein the ratio of said second capacitance value to said second parasitic capacitance is similar to the ratio of said first capacitance value to said first parasitic capacitance;
    a third capacitance module in communication with said second capacitance module, said third capacitance module comprising a third capacitance value, a third switch and a third parasitic capacitance value, said third capacitance value different in magnitude than said first capacitance value and said second capacitance value, wherein the ratio of said third capacitance value to said third parasitic capacitance is similar to the ratio of said first capacitance value to said first parasitic capacitance, and wherein said third capacitance value of said third capacitance module comprises at least three capacitors, one of said capacitors organized in parallel with said third switch and two of said capacitors organized in series with said third switch; and
    a control signal coupled to said first and second switches, said control signal configured to selectively enable said first and second switches in a manner which varies the amount of capacitance applied to said oscillator.

12. A wireless communications device having an operating frequency which can be varied with a variable capacitor, said wireless communications device comprising:
    wireless communications circuitry which is configured to transmit and receive data;
    an oscillator in communication with said wireless communications circuitry, said oscillator configured to generate a frequency signal which alters the operation of said wireless communications circuitry, said oscillator further configured to vary said frequency signal in response to different capacitance values;
    a first capacitance module in communication with said oscillator, said first capacitance module comprising a first capacitance value, a first switch and a first parasitic capacitance value;
    a second capacitance module in communication with said first capacitance module, said second capacitance module comprising a second capacitance value, a second switch, and a second parasitic capacitance value, wherein said second capacitance value is different in magnitude than said first capacitance value and wherein the ratio of said second capacitance value to said second parasitic capacitance is similar to the ratio of said first capacitance value to said first parasitic capacitance wherein said second capacitance value comprises at least two capacitors, one of said capacitors organized in series with said second switch and one of said capacitors organized in parallel with said second switch and wherein said second switch selectively enables at least one of said capacitors;

a third capacitance module in communication with said second capacitance module, said third capacitance module comprising a third capacitance value, a third switch and a third parasitic capacitance value, said third capacitance value different in magnitude than said first capacitance value and said second capacitance value, wherein the ratio of said third capacitance value to said third parasitic capacitance is similar to the ratio of said first capacitance value to said first parasitic capacitance; and a control signal coupled to said first and second switches, said control signal configured to selectively enable said first and second switches in a manner which varies the amount of capacitance applied to said oscillator.

13. A capacitance adjustment array comprising:

a first capacitance module comprising a first capacitance value, a first set of switches and a first parasitic capacitance value; and a second capacitance module comprising a second capacitance value which is different in magnitude than said first capacitance value, a second set of switches and a second parasitic capacitance value, wherein the relationship of said second capacitance value and said second parasitic capacitance value is similar to the relationship of said first capacitance value and said first parasitic capacitance value, and wherein the number of switches in said first set of switches differs from the number of switches in said second set of switches.

14. A capacitance adjustment array comprising:

a first capacitance module comprising a first capacitance value, a first set of switches, a first parasitic capacitance value, and a first connection line; and a second capacitance module comprising a second capacitance value which is different in magnitude than said first capacitance value, a second set of switches, a second parasitic capacitance value, wherein the relationship of said second capacitance value and said second parasitic capacitance value is similar to the relationship of said first capacitance value and said first parasitic capacitance value, and a second connection line, wherein the size of said second connection line differs in size from the size of said first connection line.

15. The capacitance adjustment array of claim 14 wherein said first parasitic capacitance value comprises the parasitic capacitance associated with said first capacitance value, said first set of switches and said first connection line.

16. The capacitance adjustment array of claim 15 wherein said second parasitic capacitance value comprises the parasitic capacitance associated with said second capacitance value, said second set of switches and said second connection line.

17. A method of providing a variable capacitance comprising:

providing a first capacitance value which differs from a second capacitance value;

defining a relationship between said first capacitance value and a first parasitic capacitance value; and maintaining a similar relationship between said second capacitance value and a second parasitic capacitance value, said maintaining a similar relationship comprises increasing the size of a connection line to increase said second parasitic capacitance value.

* * * * *

UNITED STATES PATENT AND TRADEMARK OFFICE
CERTIFICATE OF CORRECTION

PATENT NO. : 6,181,218 B1  
DATED : January 30, 2001  
INVENTOR(S) : Ricke W. Clark, Jorge A. Grilo and Bo Zhang Page 1 of 1

It is certified that error appears in the above-identified patent and that said Letters Patent is hereby corrected as shown below:

Column 31, claim 3,  
Line 30, "capacitance by increasing the size of a connection."

Column 32, claim 12,  
Line 66, "capacitance wherein said second capacitance value comprises at least two capacitors, one of said capacitors organized in series with said second switch and one of said capacitors organized in parallel with said second switch and wherein said second switch selectively enables at least one of said capacitors;"

Column 33, claim 12,  
Line 15, "; and"

Column 1,  
Line 11, -- capacitance with at least one non-operational connection --

Column 3,  
Line 16, -- capacitance; --  
Line 22, -- , and wherein said third switch selectively enables at least one of said capacitors; and --

Signed and Sealed this

Twenty-seventh of November, 2001

Attest:

NICHOLAS P. GODICI  
Attesting Officer    Acting Director of the United States Patent and Trademark Office